(12) United States Patent
Hikosaka et al.

(10) Patent No.: US 6,710,422 B2
(45) Date of Patent: Mar. 23, 2004

(54) SEMICONDUCTOR DEVICE AND METHOD OF MANUFACTURING THE SAME

(75) Inventors: Yukinobu Hikosaka, Kawasaki (JP); Akio Itoh, Kawasaki (JP); Kazuaki Takai, Kawasaki (JP); Takeyasu Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/212,092

(22) Filed: Aug. 6, 2002

(65) Prior Publication Data
US 2003/0127703 A1 Jul. 10, 2003

(30) Foreign Application Priority Data
Jan. 8, 2002 (JP) ........................................ 2002-001675

(51) Int. Cl.⁷ ............................................... H01L 29/72
(52) U.S. Cl. ................... 257/520; 257/306; 257/310; 257/324; 257/637; 257/790; 438/239; 438/243
(58) Field of Search ........................ 257/520, 310, 257/306, 324, 637, 790; 438/239, 243

(56) References Cited
U.S. PATENT DOCUMENTS
6,509,601 B1 * 1/2003 Lee et al. .................... 257/310

FOREIGN PATENT DOCUMENTS
JP  10-303398   11/1998
JP  2001-44376   2/2001

\* cited by examiner

Primary Examiner—Edward Wojciechowicz
(74) Attorney, Agent, or Firm—Armstrong, Kratz, Quintos, Hanson & Brooks, LLP

(57) ABSTRACT

A semiconductor device having conductive plug for connecting capacitor and conductive pattern, comprises first and second impurity diffusion regions formed in a semiconductor substrate, a first insulating film formed over the semiconductor substrate, a first hole formed in the first insulating film on the first impurity diffusion region, a first conductive plug formed in the first hole and made of a metal film, a second hole formed in the first insulating film on the second impurity diffusion region, a second conductive plug formed in the second hole and made of conductive material that is hard to be oxidized rather than the metal film, and a capacitor that consists of a lower electrode connected to an upper surface of the second conductive plug, a dielectric film, and an upper electrode.

24 Claims, 18 Drawing Sheets

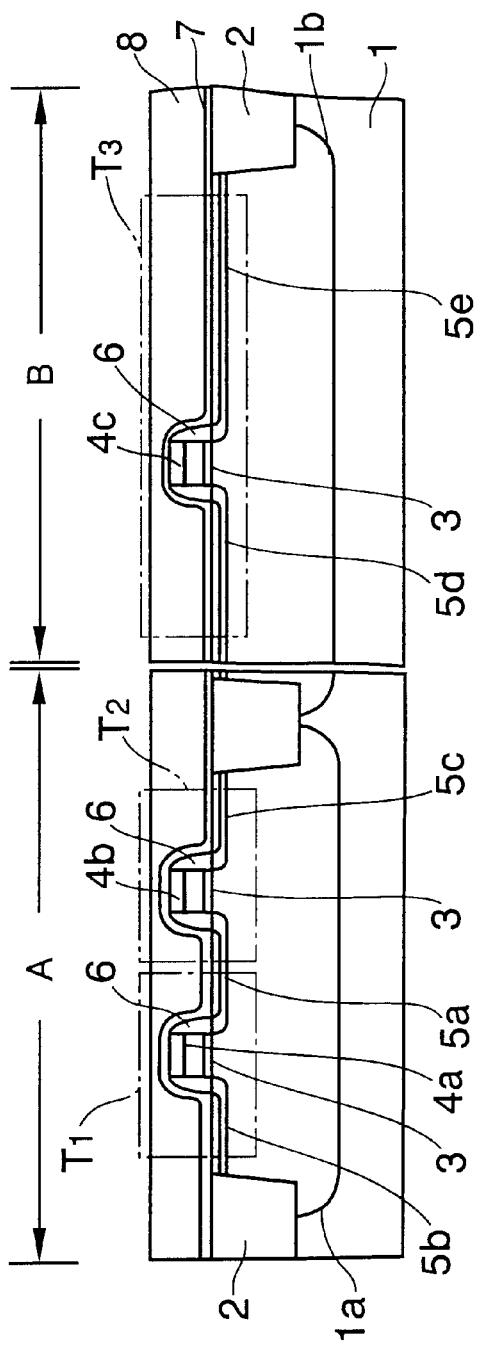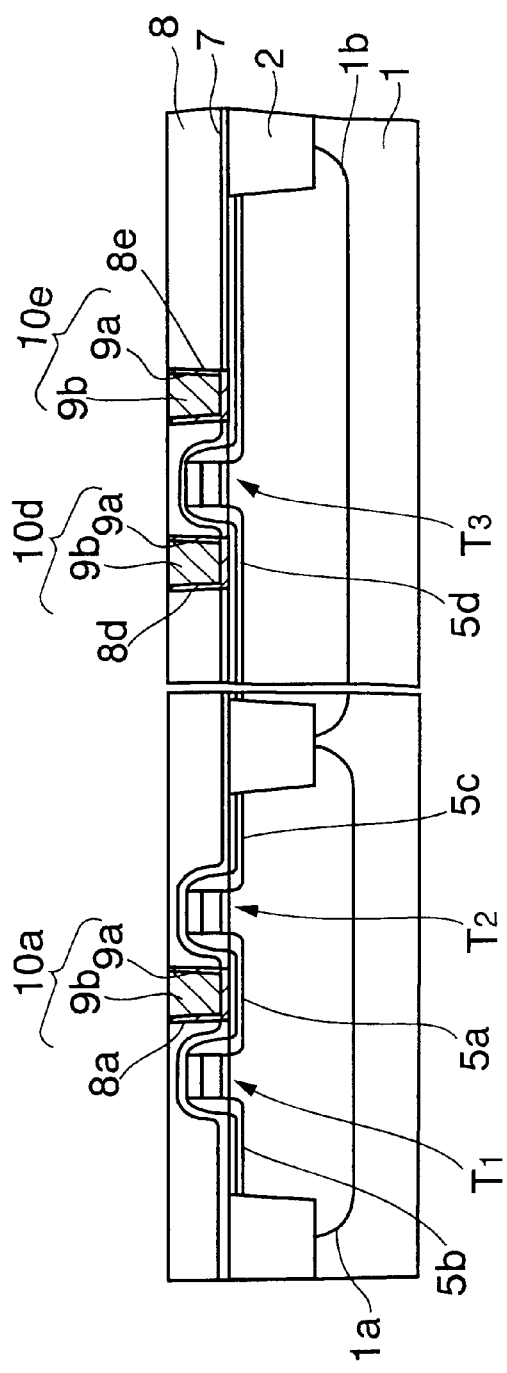
FIG. 2A
FIG. 2B

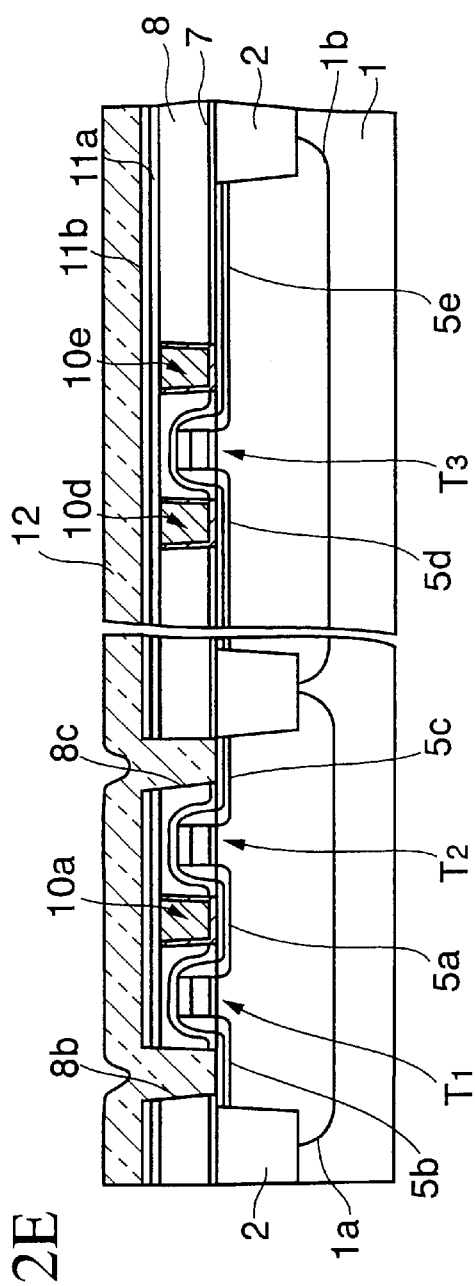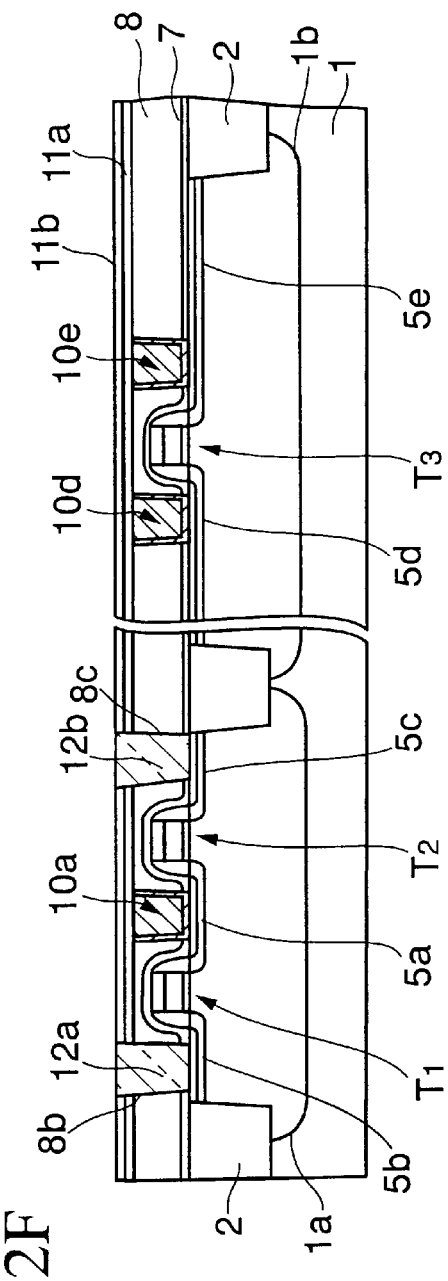

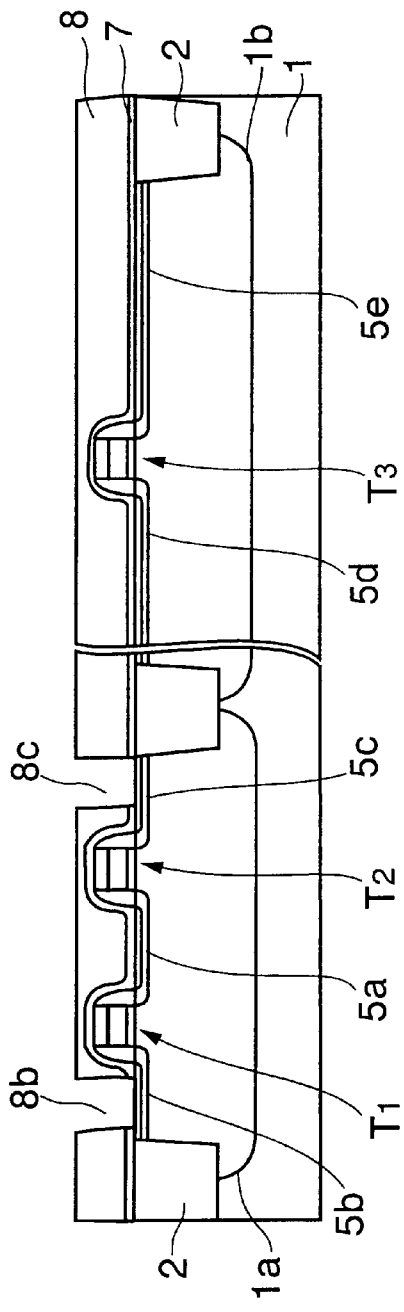
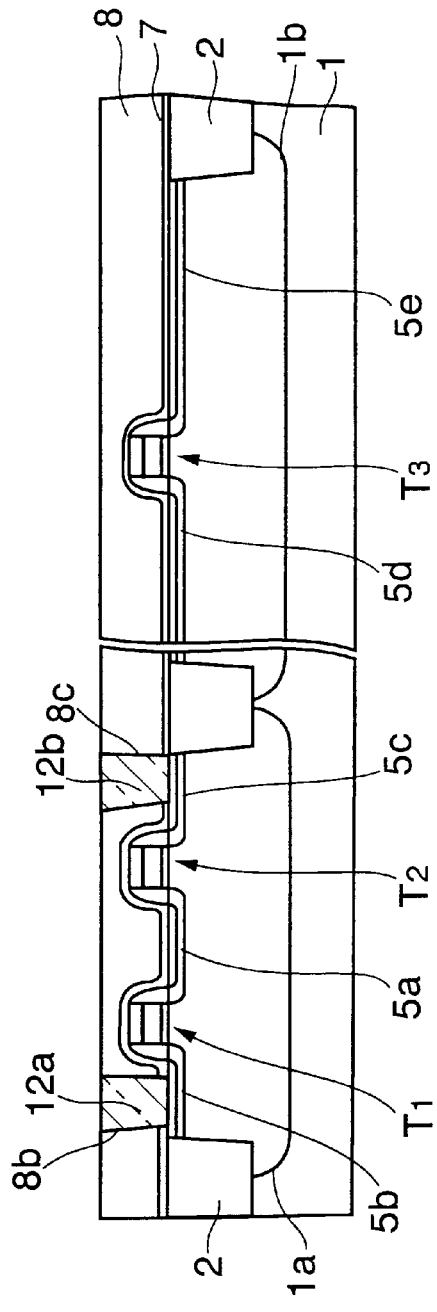
FIG. 4A
FIG. 4B

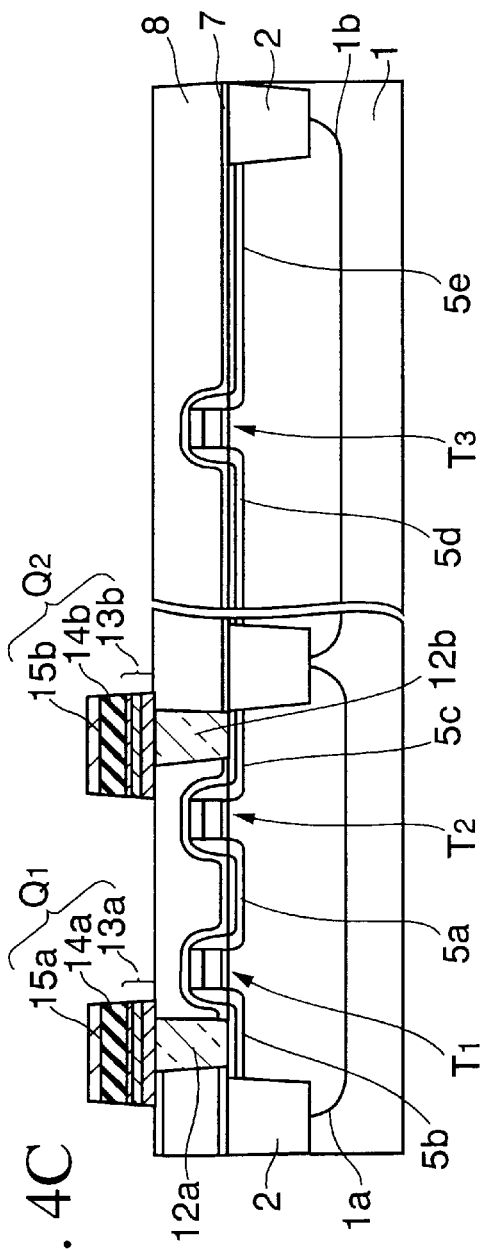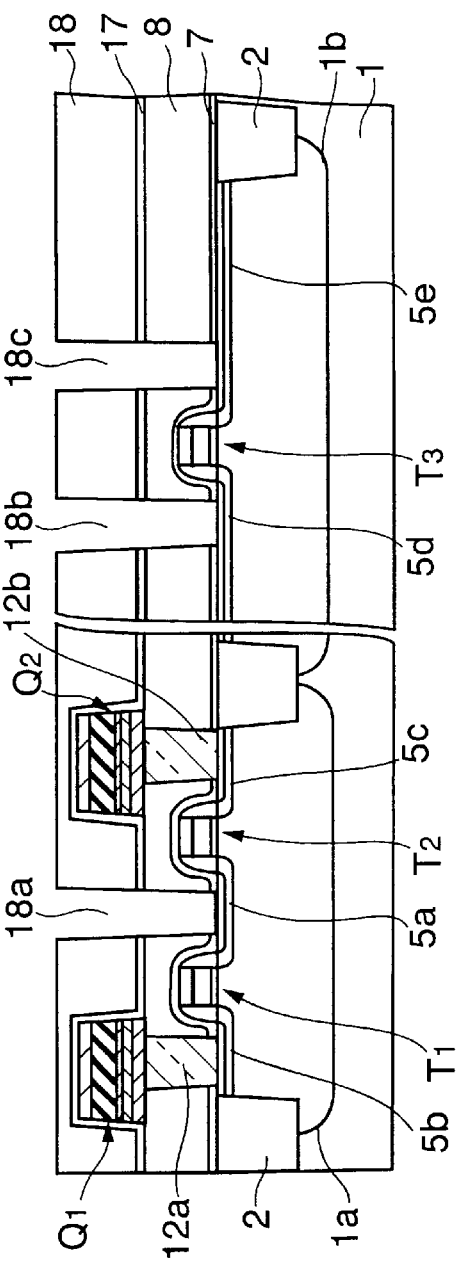

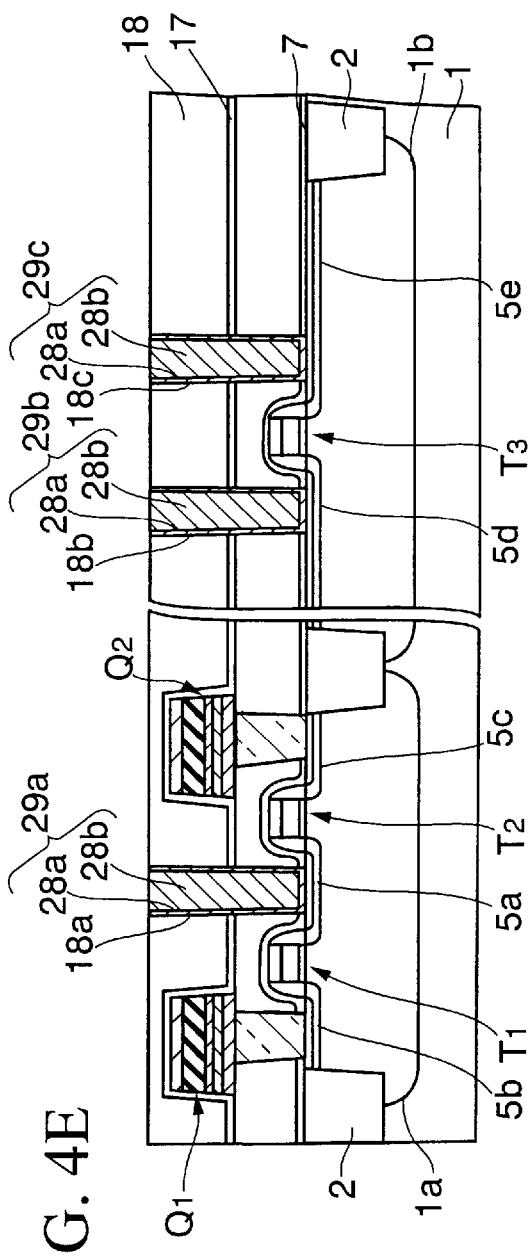
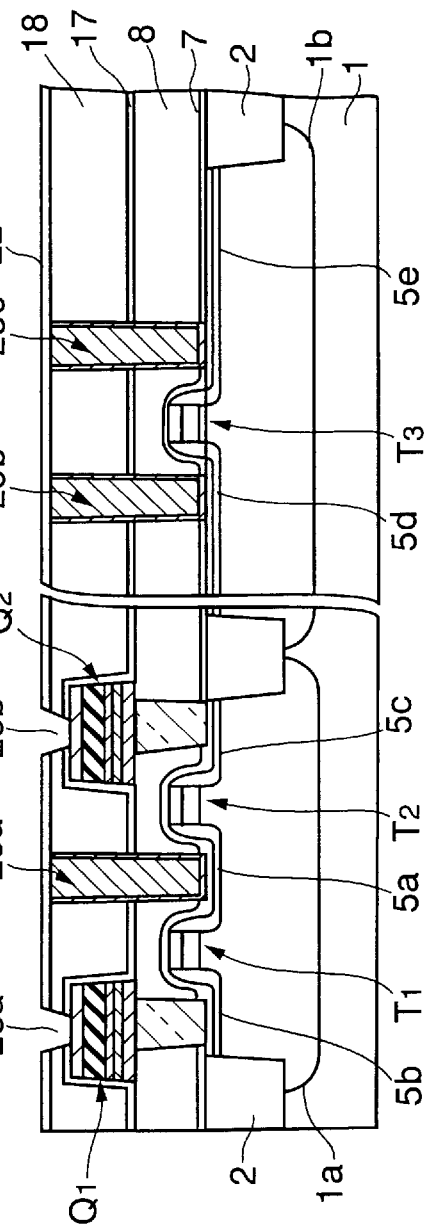

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2002-1675, filed in Jan. 8, 2002, the contents being incorporated herein by reference.

BACKGROUND OF THE INVENTION

1. Field of the Invention

The present invention relates to a semiconductor device and a method of manufacturing the same and, more particularly, a semiconductor device having conductive plugs for connecting a capacitor and a conductive pattern and a method of manufacturing the same.

2. Description of the Prior Art

The ferroelectric capacitor constituting the FeRAM (Ferroelectric Random Access Memory), which is currently mass-produced, has such a structure that wirings are connected onto both the lower electrode and the upper electrode, i.e., the planar structure. In the ferroelectric capacitor having the planar structure, the contact area of the lower electrode is shaped to protrude from the side of the ferroelectric film.

Corresponding to the requirements of the higher integration of the FeRAM, the capacitor having the stacked structure, which is able to reduce the memory cell area smaller, is being developed. The stacked structure is the structure in which the conductive plug is connected to the undersurface of the lower electrode of the ferroelectric capacitor.

Next, steps of forming the capacitor having the stacked structure is explained with reference to FIGS. 1A, 1B, and 1C.

First, steps required until the structure shown in FIG. 1A is obtained will be explained hereunder.

MOS transistors 102 are formed on a silicon substrate 101, and then a first interlayer insulating film 103 for covering the MOS transistors 102 is formed.

The MOS transistors 102 are formed on the silicon substrate 101 in a well region 105 that is surrounded by an element isolation layer 104. Each of the MOS transistors 102 has a gate electrode 102b formed on the silicon substrate 101 via a gate insulting film 102a, and impurity diffusion regions 102c serving as source/drain formed on both sides of the gate electrode 102b in the well region 105. Also, insulating sidewalls 106 used to form high concentration impurity regions 102d in the impurity diffusion regions 102c are formed on both side surfaces of the gate electrode 102b.

First contact holes 103a are formed in the first interlayer insulating film 103 on one impurity diffusion regions 102c of the MOS transistors 102, and then a first contact plug 107 is buried in the first contact holes 103a respectively.

The material constituting the first contact plug 107 is the same as that constituting other contact plugs (not shown) that are not connected to the lower electrode of the capacitor. For example, in Patent Application Publication (KOKAI) 2001-44376, the contact plug connected to the lower electrode of the capacitor and the contact plug not connected to the lower electrode of the capacitor are formed of tungsten or polysilicon that is formed by the same step.

Then, a first metal film 108, a ferroelectric film 109, and a second metal film 110 are formed sequentially on the first contact plugs 107 and the first interlayer insulating film 103.

Then, as shown in FIG. 1B, the first metal film 108, the ferroelectric film 109, and the second metal film 110 are patterned by using a hard mask continually, so that the first metal film 108 is shaped into a lower electrode 108a of a capacitor 111, the ferroelectric film 109 is shaped into a ferroelectric film 109a of the capacitor 111, and the second metal film 110 is shaped into an upper electrode 110a of the capacitor 111. In this case, the capacitor 111 is the stacked-type capacitor, and the lower electrode 108a is connected to one impurity diffusion region 102c of the MOS transistor 102 via the underlying first contact plug 107.

Then, as shown in FIG. 1C, a capacitor protection film 112 is formed on the capacitors 111 and the first interlayer insulating film 103, and then a second interlayer insulating film 113 is formed on the capacitor protection film 112. Then, a second contact hole 113a is formed on the other impurity diffusion regions 102c of the MOS transistors 102 by patterning the second interlayer insulating film 113, the capacitor protection film 112 and the first interlayer insulating film 103 by virtue of the photolithography method. Then, a second contact plug 114 is formed in the second contact hole 113a. This second contact plug 114 is formed to connect the bit line (not shown), which is formed on the second contact plug 114, and the impurity diffusion regions 102c.

Meanwhile, in many cases the FeRAM is mounted mixedly with the logic semiconductor device. As the embedded device in which the FeRAM and the logic circuit are mixed, there are the security associated chip which requires the authentication and the IC card employed in the local self-governing body.

In the logic semiconductor device, the tungsten plug is employed as the plug to connect the underlying conductive pattern and the overlying conductive pattern, and in addition the resistance value of the tungsten plug is employed as the spice parameter used to design the circuit.

Accordingly, in the sense to utilize the circuit design resource accumulated up to this time and reduce the developmental man-hour and cost, the logic-embedded FeRAM needs the tungsten plug.

By the way, various heat treatments such as the crystallizing annealing, the recovery annealing, or the like are needed in the oxygen containing atmosphere to form the ferroelectric capacitor. Typically the RTA (Rapid Thermal Annealing) process is carried out at 750° C. for 60 seconds as the annealing for crystallizing the ferroelectric film. Also, after the formation of the capacitor, the film quality recovery annealing of the ferroelectric film is carried out in the furnace at 650° C. for 60 minutes.

Here, as shown in FIGS. 1B and 1C, if the tungsten plug is employed as the first contact plugs 107 formed immediately under the lower electrodes 108a of the capacitors 111, the tungsten plug is oxidized at the very high speed and at the low temperature in the annealing process in the oxygen containing atmosphere.

When the tungsten plug starts to oxidize, such oxidation spreads over the entire plug. Thus, the contact failure of the lower electrode easily occurs, so that the reduction in yield of the FeRAM device is caused. Such oxidation of the tungsten plug is also set forth in Patent Application Publication (KOKAI) Hei 10-303398. In order to keep the normal contact by preventing the oxidation of the tungsten plug, the heating temperature in the annealing process of the capacitor must be lowered much more.

Therefore, the improvement in performance of the ferroelectric capacitor and the improvement in contact performance of the tungsten plug are in the trade-off relationship.

As described above, the second contact hole 113a for connecting the bit line and the impurity diffusion regions is opened after the capacitors 111 and the second interlayer insulating film 113 are formed. This is because, if the second contact hole for the bit line connection is formed in the first interlayer insulating film 103 simultaneously with the first contact hole 103a, the upper surface of the tungsten plug formed in the second contact hole is exposed after the formation of the capacitor and then oxidized.

However, the aspect ratio of the second contact hole 113a shown FIG. 1C is increased with the future miniaturization of the FeRAM. Thus, the etching technology for forming the second contact hole 113a, the formation of the glue layer acting as the underlying layer before the tungsten is buried in the second contact hole 113a, etc. should be improved.

SUMMARY OF THE INVENTION

It is an object of the present invention to provide a semiconductor device capable of improving a yield of a contact plug formed directly under the capacitor lower electrode and also facilitating the design of remaining contact plugs, and a method of manufacturing the same.

The above subject can be overcome by providing a semiconductor device which comprises first and second impurity diffusion regions constituting a transistor formed in a semiconductor substrate; a first insulating film formed over the semiconductor substrate; a first hole formed in the first insulating film above the first impurity diffusion region; a first conductive plug formed in the first hole and made of a metal film; a second hole formed in the first insulating film above the second impurity diffusion region; a second conductive plug formed on the second hole and made of conductive material that is hard to be oxidized rather than the metal film; and a capacitor consisting of a lower electrode connected to an upper surface of the second conductive plug, a dielectric film formed of one of ferroelectric substance and high-dielectric substance, and an upper electrode.

Also, the above subject can be overcome by providing a semiconductor device manufacturing method which comprises the steps of forming a transistor having first and second impurity diffusion regions formed in a semiconductor substrate; forming a first insulating film, which covers the transistor, over the semiconductor substrate; forming a first hole in the first insulating film on the first impurity diffusion region; forming a first conductive plug made of a metal film in the first hole; forming a second conductive plug, which is made of conductive material that is hard to be oxidized rather than the metal film, in the first insulating film on the second impurity diffusion region; forming a first conductive film, a dielectric film made of any one of ferroelectric substance and high-dielectric substance, and a second conductive film sequentially on the second conductive plug and the first insulating film; and forming a capacitor on the second conductive plug by patterning the second conductive film, the dielectric film, and the first conductive film.

According to the present invention, the conductive material constituting the conductive plugs formed directly under the lower electrode of the capacitor is formed of the material that is less oxidized than the metal of the other conductive plug. For example, the conductive plug formed just under the capacitor is made of any one of doped silicon and oxide conductive material, and also other conductive plugs are formed of a film that contains the tungsten.

In the situation that the conductive film serving as the lower electrode of the capacitor is formed on the conductive plug that is made of doped silicon or oxide conductive material, the conductive plug formed directly under the capacitor is difficult to be oxidized by the annealing in the oxygen containing atmosphere. Thus, the conductive plug makes good connection between the capacitor and the impurity diffusion region, and improves the yield of the device.

Also, other conductive plugs not formed just under the capacitor are formed of the metal film, which has the smaller electric resistance than the doped silicon or the oxide conductive material, to consider preferentially the reduction in the electric resistance. Therefore, the conventional design rule can be applied to the logic circuit and the bit signal.

In this case, when the crystallization annealing of the ferroelectric film constituting the capacitor or the oxygen annealing after the formation of the capacitor is carried out, the conductive plugs not formed just under the capacitor can be prevented from being oxidized by covering the conductive plugs with the oxidation preventing film.

BRIEF DESCRIPTION OF THE DRAWINGS

FIGS. 4A to 4G are sectional views showing steps of manufacturing a semiconductor device according to a third embodiment of the present invention;

DESCRIPTION OF THE PREFERRED EMBODIMENTS

Embodiments of the present invention will be explained with reference to the drawings hereinafter.

(The First Embodiment)

Figure 1A:
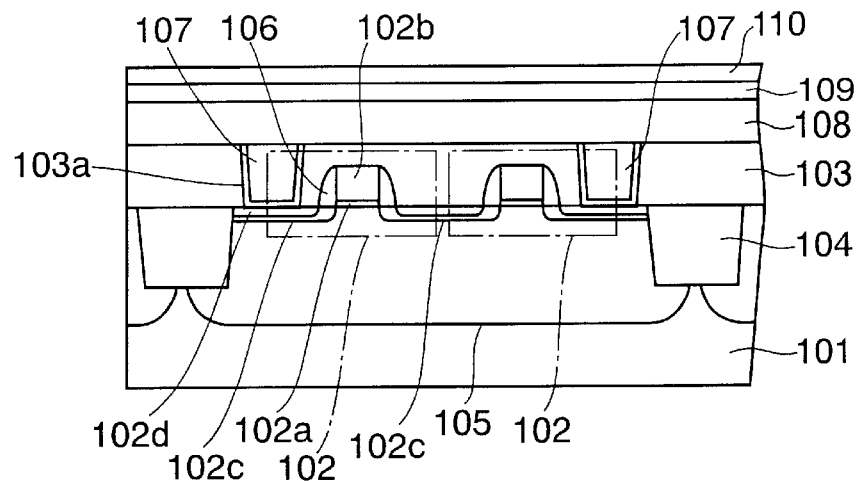
FIGS. 1A, 1B, 1C are sectional views showing steps of manufacturing the semiconductor device in the prior art.
Figure 1B:
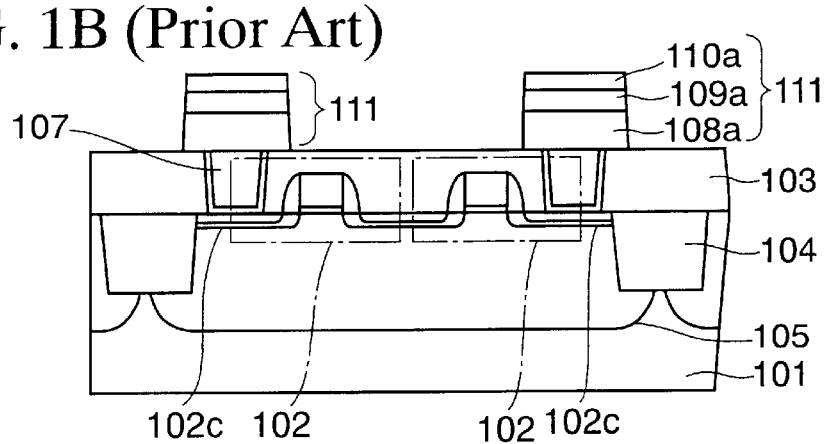
Figure 1C:
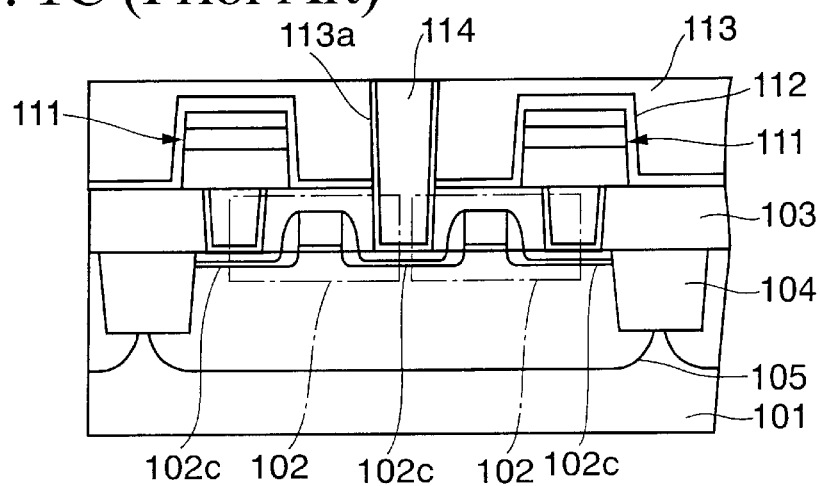
Figure 2C:
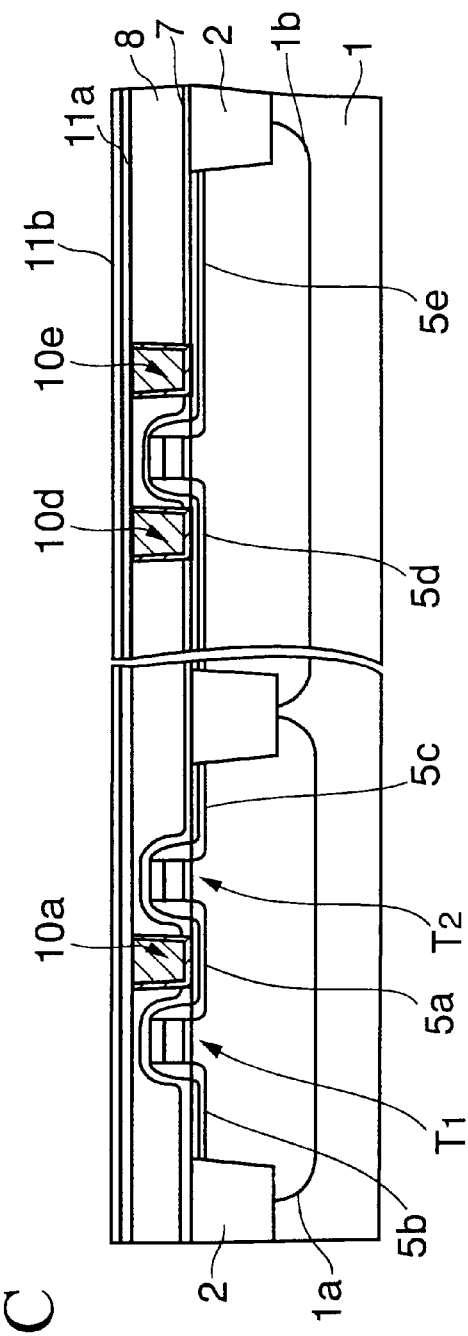
FIGS. 2A to 2N are sectional views showing steps of manufacturing a semiconductor device according to a first embodiment of the present invention.
Figure 2D:
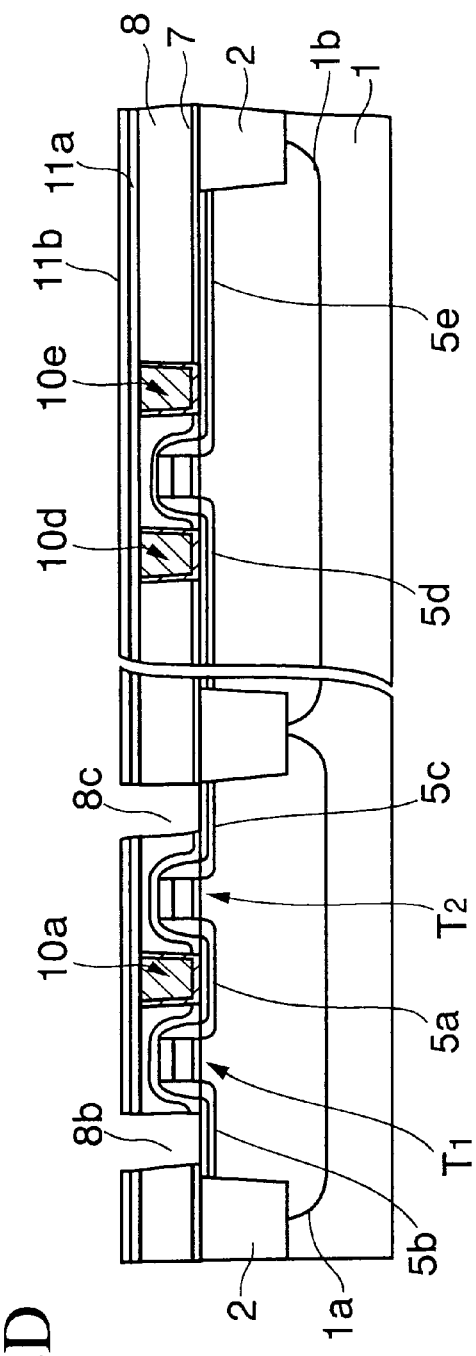
Figure 2G:
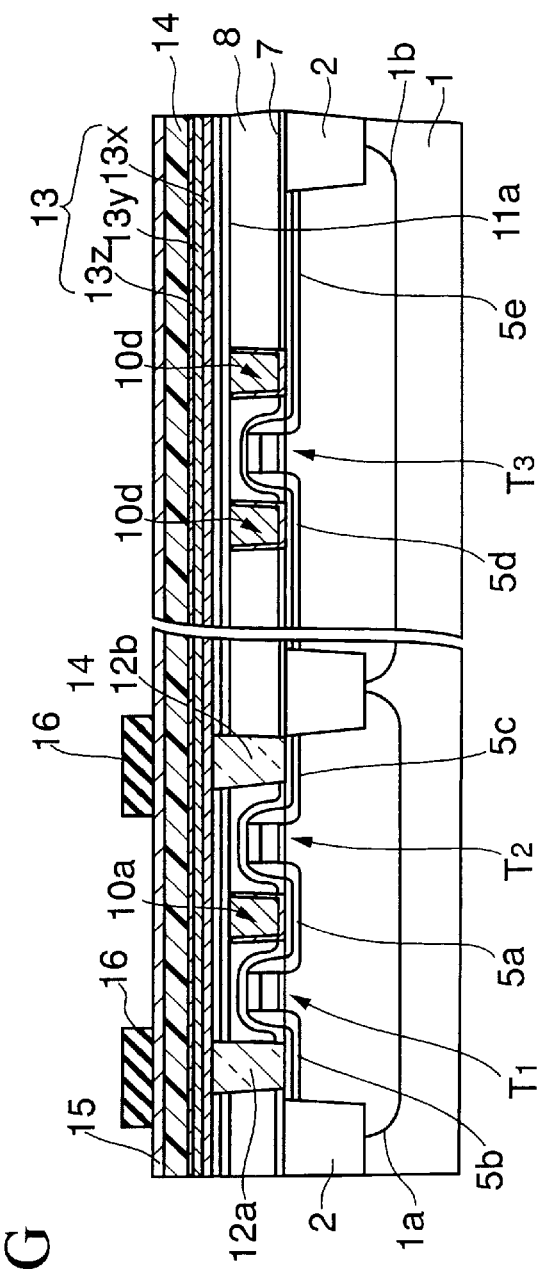
Figure 2H:
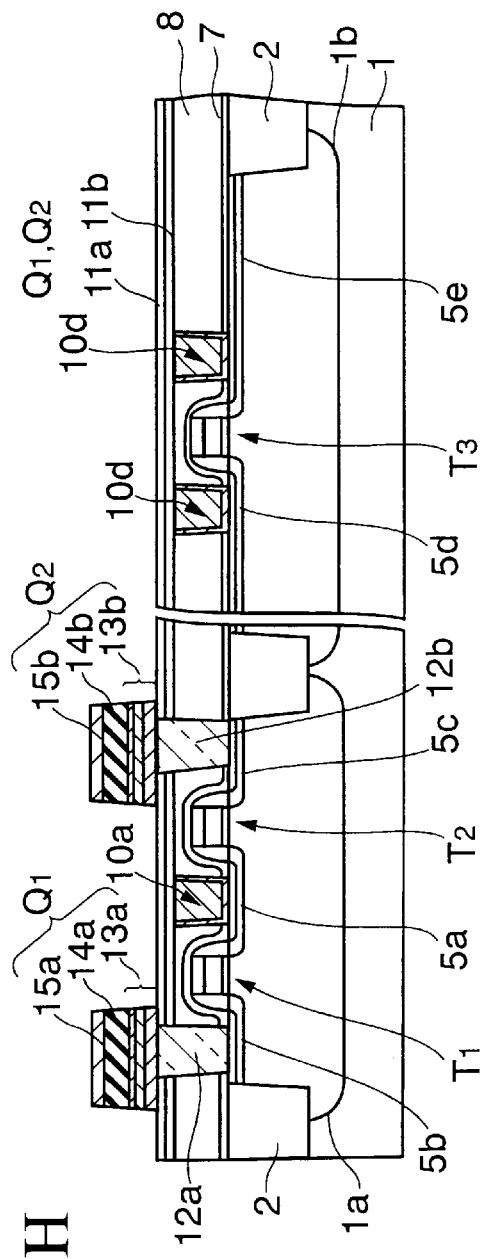
Figure 2I:
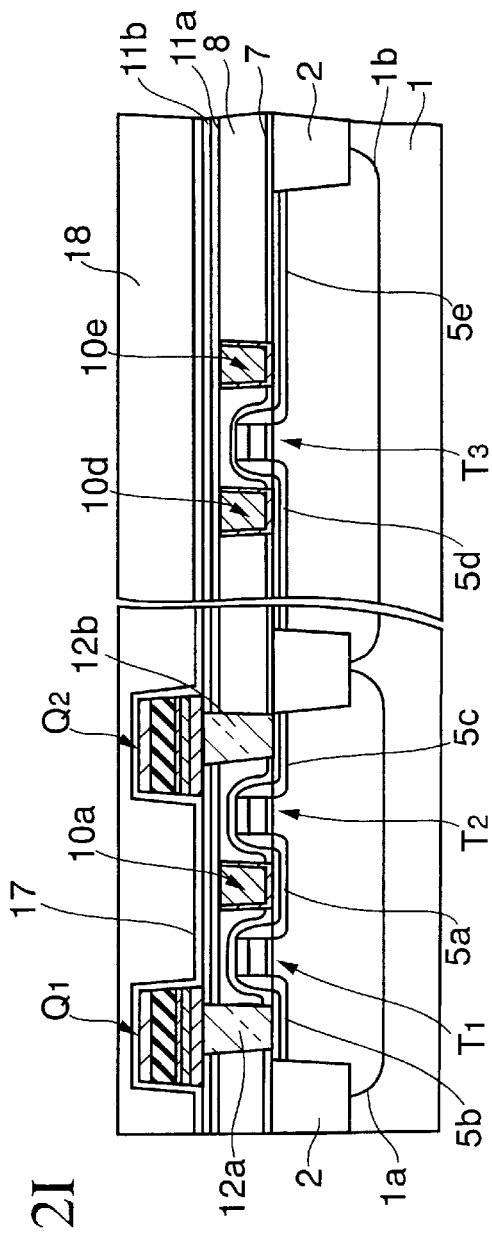
Figure 2J:
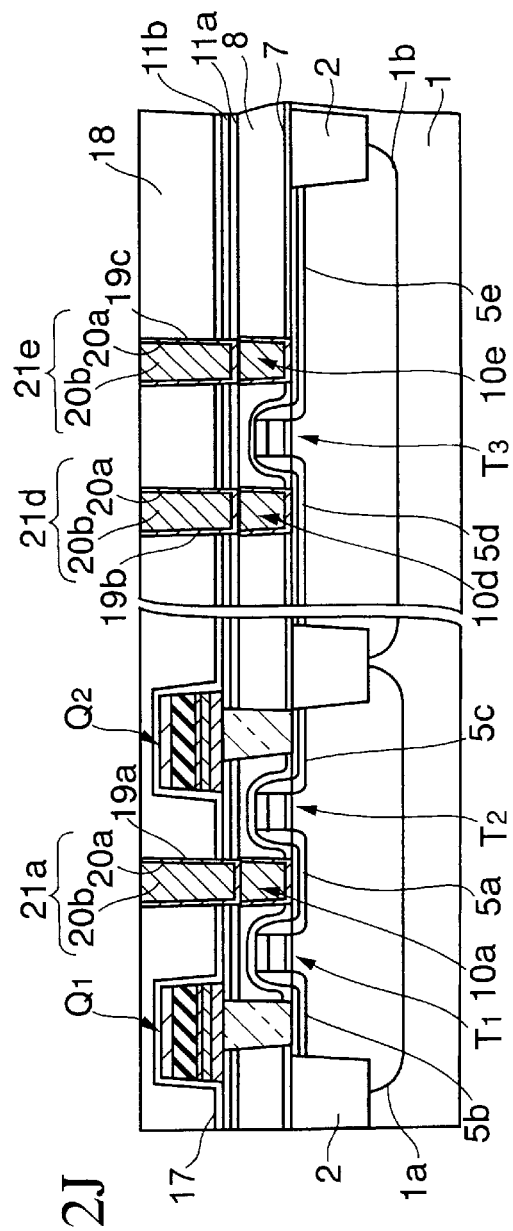
Figure 2K:
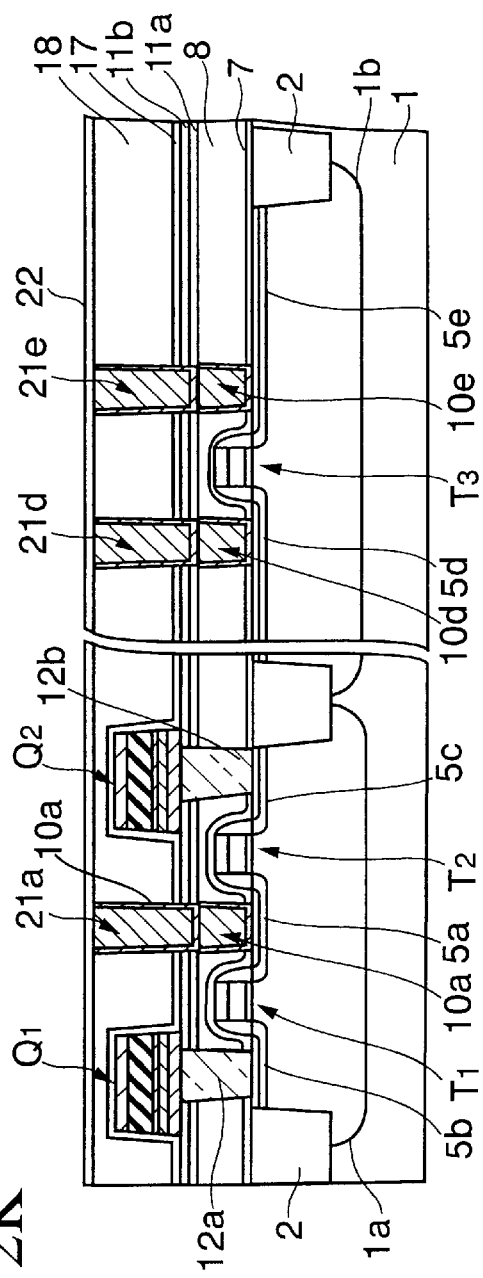
Figure 2L:
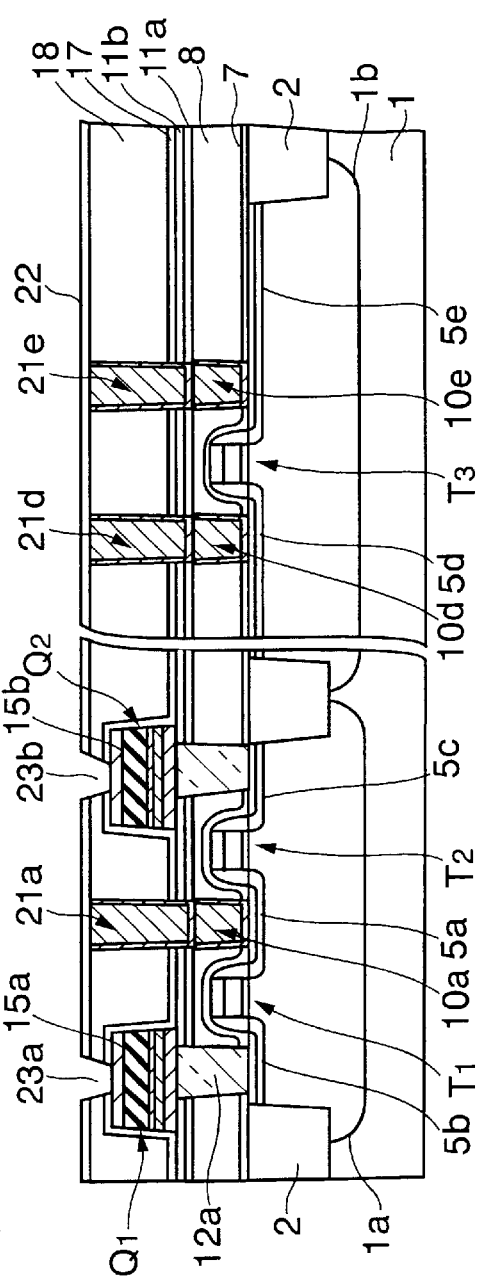
Figure 2M:
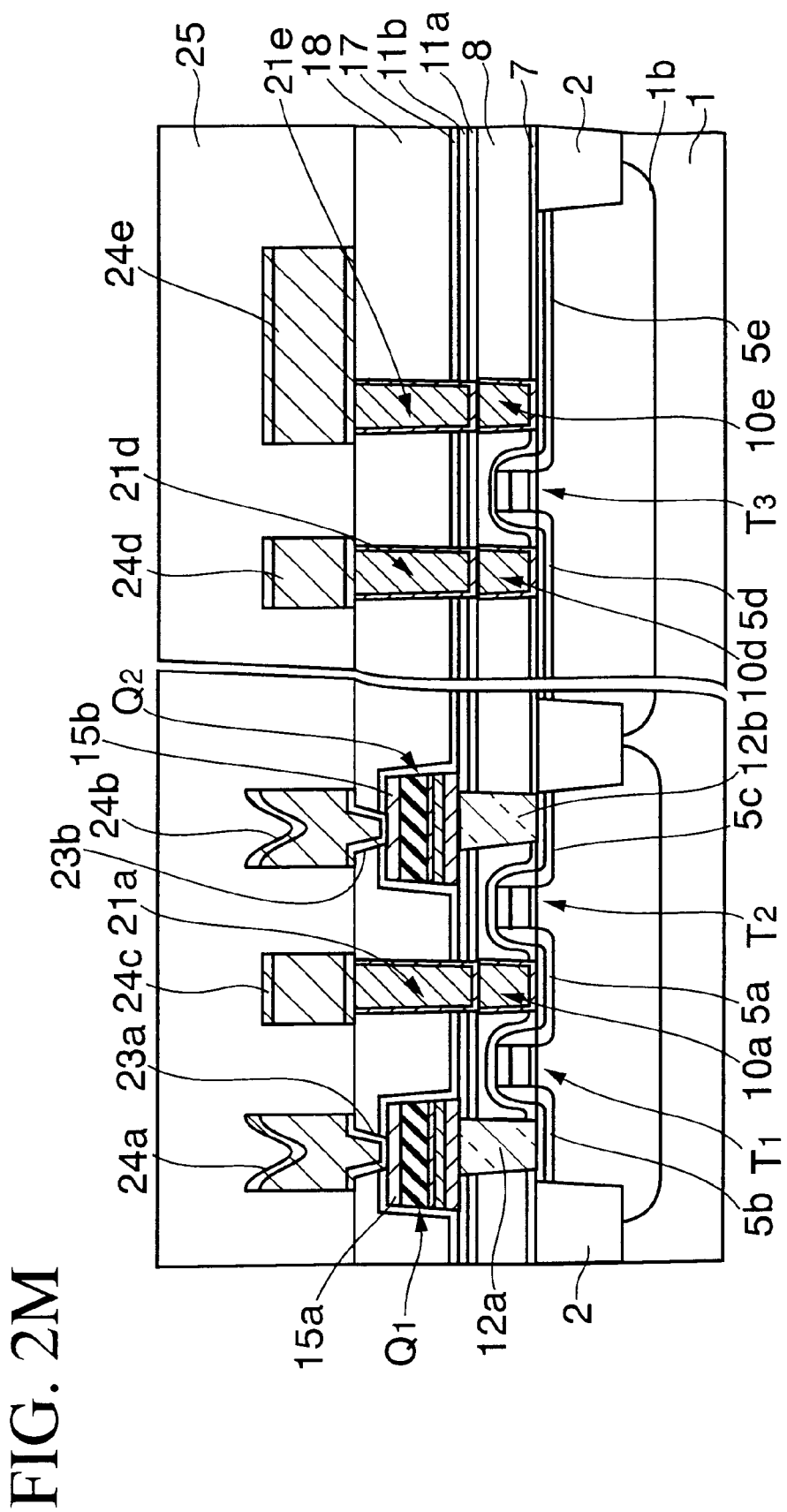
Figure 2N:
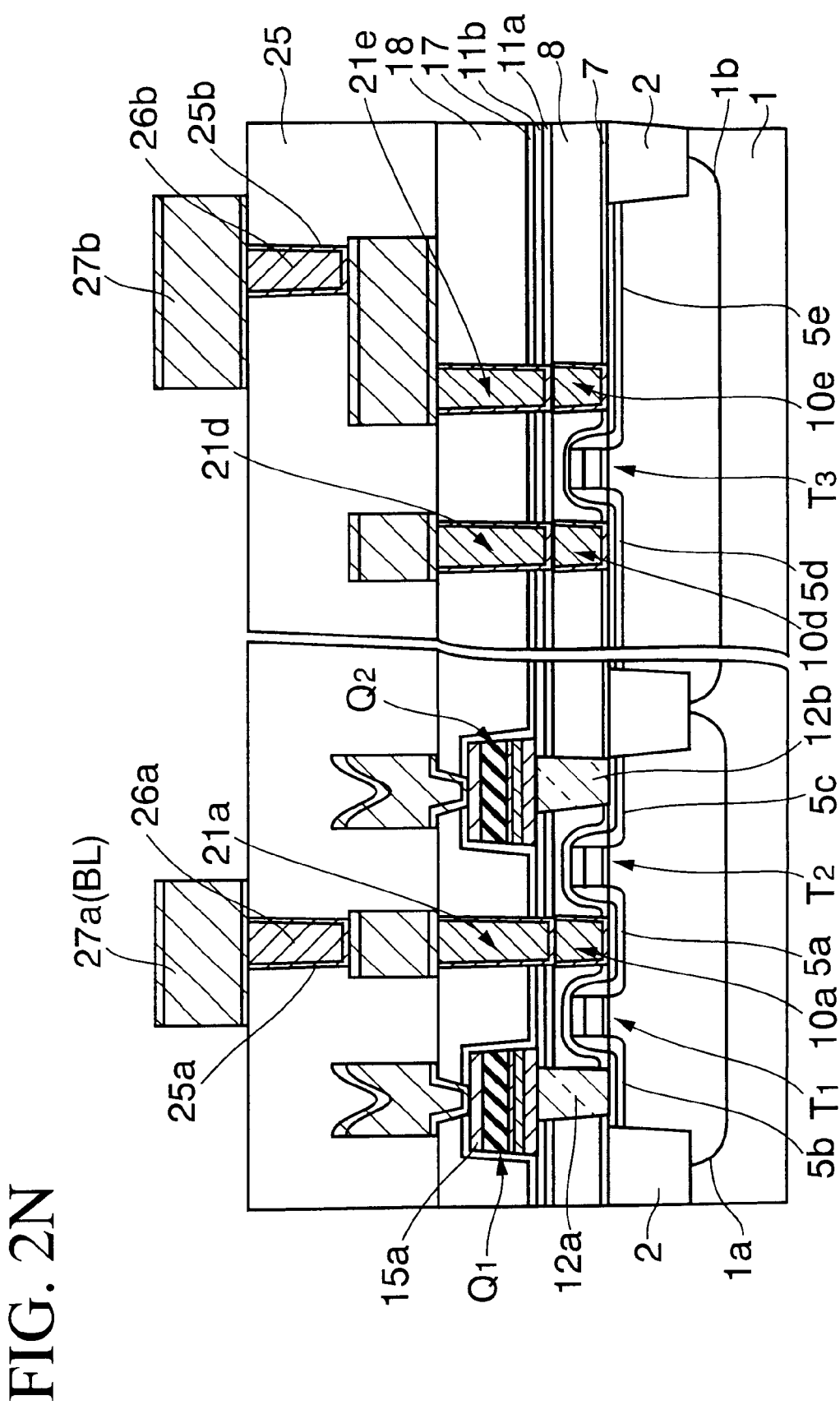

FIG. 2A to FIG. 2N are sectional views showing steps of manufacturing a semiconductor device according to a first embodiment of the present invention.

First, steps required until a sectional structure shown in FIG. 2A is obtained will be explained hereunder.

As shown in FIG. 2A, element isolation recesses are formed around the transistor forming regions of an n-type or p-type silicon (semiconductor) substrate 1 by the photolithography method, and then element isolation insulating films 2 are formed by burying silicon oxide ($SiO_2$) therein. The element isolation insulating film 2 having such structure is called STI (Shallow Trench Isolation). In this case, the insulating film formed by the LOCOS (Local Oxidation of Silicon) method may be employed as the element isolation insulating film.

Then, wells 1a, 1b are formed by introducing selectively an n-type impurity or a p-type impurity into predetermined transistor forming regions of a memory cell region A and a logic region B of the silicon substrate 1 respectively. In FIG. 2A, the well 1a in the memory cell region A is p-type and the well 1b in the logic region B is n-type. If CMOS is formed in the logic region B, both the n-type and p-type wells are formed. The individual formation of the n-type well and the p-type well is carried out by using the resist pattern as a mask.

Then, a silicon oxide film serving as a gate insulating film 3 is formed by thermally oxidizing surfaces of the wells 1a, 1b on the silicon substrate 1.

Then, an amorphous silicon or polysilicon film and a tungsten silicide film are formed sequentially on the overall upper surface of the silicon substrate 1. After this, the silicon film and the tungsten silicide film are patterned by the photolithography method, whereby gate electrodes 4a, 4b are formed on the well 1a in the memory cell region A and simultaneously a gate electrode 4c is formed on the well 1b in the logic region B. The cobalt silicide may be used instead of the tungsten silicide. These gate electrodes 4a, 4b, 4c are formed on the silicon substrate 1 via the gate insulating film 3.

In the memory cell region A, two gate electrodes 4a, 4b are formed in parallel on one well 1a, and these gate electrodes 4a, 4b constitute a part of the word line.

Then, in the memory cell region A, first to third n-type impurity diffusion regions 5a to 5c serving as the source/drain are formed by ion-implanting the n-type impurity, e.g., phosphorus into the p-type well 1a on both sides of the gate electrodes 4a, 4b. At the same time, in the logic region B, the n-type impurity diffusion regions serving as the source/drain are also formed by ion-implanting the n-type impurity into the p-type well (not shown).

In addition, the p-type impurity, e.g., boron is ion-implanted into the n-type well 1b in the logic region B on both sides of the gate electrode 4c, so that first and second p-type impurity diffusion regions 5d, 5e are formed.

In this case, the individual implantation of the n-type impurity and the p-type impurity is carried out by using the resist pattern.

Then, an insulating film, e.g., a silicon oxide film ($SiO_2$) film is formed on the overall surface of the silicon substrate 1 by the CVD method, and then the insulating film is etched back and left as insulating sidewall spacers 6 on both side portions of the gate electrodes 4a, 4b, 4c.

Then, in the memory cell region A, high concentration impurity regions are formed in the first to third n-type impurity diffusion regions 5a to 5c respectively by ion-implanting the n-type impurity into the first to third n-type impurity diffusion regions 5a to 5c again while using the gate electrodes 4a, 4b and the sidewall spacers 6 as a mask. At the same time, high concentration impurity regions are formed by ion-implanting the n-type impurity into the n-type impurity diffusion region in the logic region B.

After this, in the logic region B, high concentration impurity regions are formed by ion-implanting the p-type impurity again into the first and second p-type impurity diffusion regions 5d, 5e while using the gate electrode 4c and the sidewall spacers 6 as a mask.

In this case, in one well 1a in the memory cell region A, the first n-type impurity diffusion region 5a between two gate electrodes 4a, 4b is electrically connected to the bit line, described later, and also the second and third n-type impurity diffusion regions 5b, 5c positioned near both end sides of the well 1a are electrically connected to the lower electrode of the capacitor, described later.

According to the above steps, in the p-type well 1a in the memory cell region A, two n-type MOS transistors $T_1$, $T_2$ having the gate electrodes 4a, 4b and the n-type impurity diffusion regions 5a to 5c of the LDD structure are formed to have one n-type impurity diffusion region 5a commonly.

Also, in the n-type well 1b in the logic region B, a p-type MOS transistor $T_3$ having the gate electrode 4c and the p-type impurity diffusion regions 5d, 5e is formed. In addition, in the p-type well (not shown) in the logic region B, the n-type MOS transistor is formed.

Then, a silicon oxide nitride (SiON) film having a thickness of about 200 nm and serving as a cover insulating film 7 to cover the n-type MOS transistors $T_1$, $T_2$, $T_3$ is formed on the overall surface of the silicon substrate 1 by the plasma CVD method. Then, a silicon oxide ($SiO_2$) film of about 1.0 µm thickness is formed on the cover insulating film 7 as a first interlayer insulating film 8 by the plasma CVD method using the TEOS gas.

Then, for example, the first interlayer insulating film 8 is annealed at the temperature of 700° C. for 30 minutes in the normal pressure nitrogen atmosphere, whereby the first interlayer insulating film 8 is densified. Then, an upper surface of the first interlayer insulating film 8 is planarized by the chemical mechanical polishing (CMP) method.

Next, steps required to form the structure shown in FIG. 2B will be explained hereunder.

First, the first interlayer insulating film 8 and the cover insulating film 7 are patterned by the photolithography method. Thus, a first contact hole 8a having a depth that reaches the first n-type impurity diffusion region 5a is formed in the memory cell region A and simultaneously second and third contact holes 8d, 8e are formed on the first and second p-type impurity diffusion regions 5d, 5e in the logic region B.

Then, a titanium (Ti) film of 30 nm thickness and a titanium nitride (TiN) film of 50 nm thickness are formed in sequence as a glue film 9a on the first interlayer insulating film 8 and in the first to third contact holes 8a, 8d, 8e by the sputter method. In addition, a tungsten (W) film 9b is grown on the glue film 9a by the CVD method using WF6 so as to bury perfectly insides of the contact holes 8a, 8d, 8e.

Then, the tungsten film 9b and the glue film 9a are removed from an upper surface of the first interlayer insulating film 8 by polishing them by means of the CMP method.

As a result, the tungsten film 9b and the glue film 9a left in the first contact hole 8a in the memory cell region A are used as a first conductive plug 10a that is connected to the first n-type impurity diffusion region 5a. Also, the tungsten film 9b and the glue film 9a left in the second and third contact holes 8d, 8e in the logic region B are used as second and third conductive plugs 10d, 10e that are connected to the first and second p-type impurity diffusion regions 5d, 5e.

Then, as shown in FIG. 2C, an oxidation preventing insulating film 11a that is made of silicon nitride ($Si_3N_4$) of 100 nm thickness and an underlying insulating film 11b that is made of $SiO_2$ of 100 nm thickness are formed in sequence on the first interlayer insulating film 8 and the first to third conductive plugs 10a, 10d, 10e by the plasma CVD method. The $SiO_2$ film is grown by the plasma CVD method using TEOS.

The oxidation preventing insulating film 11a is formed to prevent the event that the first to third conductive plugs 10a, 10d, 10e are abnormally oxidized at the annealing process, executed later, to cause the contact failure. It is desired that the film thickness should be set to more than 70 nm, for example. If the tungsten constituting the first to third conductive plugs 10a, 10d, 10e is abnormally oxidized, not only the electric resistance is increased but also the volume is increased, so that the tungsten may be protruded from the contact holes 8a, 8b, 8c.

Then, as shown in FIG. 2D, the underlying insulating film 11b, the oxidation preventing insulating film 11a, the first interlayer insulating film 8 and the cover insulating film 7 are etched while using the resist pattern (not shown). Thus, fourth and fifth contact holes 8b, 8c are formed on the second and third n-type impurity diffusion regions 5b, 5c in the memory cell region A.

Then, as shown in FIG. 2E, a phosphorus-doped polysilicon (semiconductor) film 12 is formed on an upper surface of an underlying insulating film 10b and in the fourth and fifth contact holes 8b, 8c by the CVD method. The fourth and fifth contact holes 8b, 8c are perfectly filled with the polysilicon film 12.

The polysilicon film 12 is grown by introducing the reaction gas consisting of silane ($SiH_4$) and phosphine ($PH_3$) into the growth atmosphere, setting the substrate temperature to 550° C., and setting the growth atmosphere to 40 Pa, for example. In this case, a flow rate of $PH_3$ is set to about 0.5% of a flow rate of $SiH_4$, and a phosphorus concentration of the polysilicon film 12 is set to $1.4 \times 10^{21}/cm^2$.

Then, as shown in FIG. 2F, the polysilicon film 12 is polished by the CMP method and removed from an upper surface of the underlying insulating film 11b. Thus, the polysilicon film 12 left in the fourth and fifth contact holes 8b, 8c is formed as fourth and fifth conductive plugs 12a, 12b respectively. In this state, the first to third conductive plugs 10a, 10d, 10e formed of tungsten are covered with the oxidation preventing insulating film 11a and the underlying insulating film 11b.

Next, steps required to form the structure shown in FIG. 2G will be explained hereunder.

First, an iridium (Ir) film 13x of 200 nm thickness, a platinum oxide (PtO) film 13y of 23 nm thickness, and a platinum (Pt) film 13z of 50 nm thickness, for example, are formed sequentially as a first conductive film 13 on the fourth and fifth conductive plugs 12a, 12b and the underlying insulating film 11b by the sputter method.

In this case, the underlying insulating film 10b is annealed before and after the formation of the first conductive film 13 to prevent the peeling-off of the film, for example. For example, RTA (Rapid Thermal Annealing) that is executed at 600 to 750° C. in the argon atmosphere is employed as the annealing method.

Then, a PZT film of 200 nm thickness, for example, is formed on the first conductive film 13 as a ferroelectric film 14 by the sputter method. In addition, as the method of forming the ferroelectric film 14, there are the MOD (Metal Organic Deposition) method, the MOCVD (Metal Organic CVD) method, the sol-gel method, and others. As the material of the ferroelectric film 14, in addition to PZT, there may be employed other PZT-based material such as PLCSZT, PLZT, etc., Bi-layer structure compound material such as $SrBi_2Ta_2O_9$, $SrBi_2(Ta,Nb)_2O_9$, etc., and other metal oxide ferroelectric substance.

Then, the ferroelectric film 14 is crystallized by annealing in the oxygen containing atmosphere. As the annealing, for example, two-step RTA process having the first step, which is executed in the mixed gas atmosphere consisting of argon (Ar) and oxygen ($O_2$) at the substrate temperature of 600° C. for 90 seconds, and the second step, which is executed in the oxygen atmosphere at the substrate temperature of 750° C. for 60 seconds, is employed.

In addition, iridium oxide ($IrO_2$) of 200 nm thickness, for example, is formed on the ferroelectric film 14 as a second conductive film 15 by the sputter method.

Then, a TiN film and an $SiO_2$ film are formed sequentially on the second conductive film 15 as hard masks 16. The hard masks 16 are patterned into the capacitor planar shape over the fourth and fifth conductive plugs 12a, 12b by the photolithography method.

Then, the second conductive film 15, the ferroelectric film 14, and the first conductive film 13 in the regions, which are not covered with the hard masks 16, are etched sequentially. In this case, the ferroelectric film 14 is etched by the sputter reaction in the atmosphere containing the halogen element.

After this, the hard masks 16 are removed.

With the above, as shown in FIG. 2H, lower electrodes 13a, 13b of capacitors $Q_1$, $Q_2$ formed of the first conductive film 13, ferroelectric films 14a, 14b of the capacitors $Q_1$, $Q_2$ formed of the ferroelectric film 14, and upper electrodes 15a, 15b of the capacitors $Q_1$, $Q_2$ formed of the second conductive film 15 are formed on the underlying film 11b in the memory cell region A. Then, in one well 1a in the memory cell region A, the lower electrode 13a of the first capacitor $Q_1$ is connected electrically to the second n-type impurity diffusion region 5b via the fourth conductive plug 12a, and also the lower electrode 13b of the second capacitor $Q_2$ is connected electrically to the third n-type impurity diffusion region 5c via the fifth conductive plug 12b.

Then, in order to recover the damage of the ferroelectric film 14 caused by the etching, the recovery annealing is carried out. The recovery annealing in this case is carried out in the furnace containing the oxygen at the substrate temperature 650° C. for 60 minutes, for example.

Then, as shown in FIG. 2I, alumina of 50 nm thickness is formed on the underlying insulating film 11b by the sputter as a capacitor protection film 17 that covers the capacitors $Q_1$, $Q_2$. Then, the capacitors $Q_1$, $Q_2$ are annealed in the oxygen containing atmosphere at 650° C. for 60 minutes. This capacitor protection film 17 protects the capacitors $Q_1$, $Q_2$ from the process damage, and may be formed of PZT in addition to the alumina.

Then, silicon oxide ($SiO_2$) of about 1.0 μm thickness is formed on the capacitor protection film 17 as a second interlayer insulating film 18 by the plasma CVD method using the TEOS gas. In addition, an upper surface of the second interlayer insulating film 18 is planarized by the CMP method. In this example, the remaining thickness of the second interlayer insulating film 18 after the CMP is set to about 300 nm on the upper electrodes 15a, 15b.

Next, steps required to form the structure shown in FIG. 2J will be explained hereunder.

First, the second interlayer insulating film 18, the capacitor protection film 17, the underlying insulating film 11b, and the oxidation preventing insulating film 11a are etched by using the resist mask (not shown). Thus, a sixth contact hole 19a is formed on the first conductive plug 11a in the memory cell region A, and also seventh and eighth contact holes 19b, 19c are formed on the second and third conductive plugs 10b, 10c in the logic region B.

Then, a TiN film of 50 nm thickness is formed sequentially as a glue film 20a in the sixth to eighth contact holes 19a to 19c and on the second interlayer insulating film 18 by the sputter method. In addition, a tungsten film 20b is grown on the glue film 20a by the CVD method to bury perfectly insides of the sixth to eighth contact holes 19a to 19c.

Then, the tungsten film 20b and the glue film 20a are polished by the CMP method to remove from an upper surface of the second interlayer insulating film 18. Then, the tungsten film 20b and the glue film 20a left in the sixth to eighth contact holes 19a to 19c are used as sixth to eighth conductive plugs 21a, 21d, 21e.

Then, the second interlayer insulating film 18 is annealed in the nitrogen plasma atmosphere at 350° C. for 120 seconds.

As a result, in the memory cell region A, the sixth conductive plug 21a is connected to the first conductive plug 10a to constitute the via-to-via contact, and then is connected electrically to the first impurity diffusion region 5a. Also, in the logic region B, the seventh and eighth conductive plugs 21d, 21e are connected to the second and third conductive plugs 10b, 10c respectively and then are connected electrically to underlying p-type impurity diffusion regions 5d, 5e.

Then, as shown in FIG. 2K, an SiON film of 100 nm thickness is formed as a second oxidation preventing film 22 on the sixth to eighth conductive plugs 21a, 21d, 21e and the second interlayer insulating film 18 by the CVD method.

Then, as shown in FIG. 2L, holes 23a, 23b are formed on the upper electrodes 15a, 15b of the capacitors $Q_1$, $Q_2$ by patterning the second oxidation preventing film 22 and the second interlayer insulating film 18 by virtue of the photolithography method. The capacitors $Q_1$, $Q_2$ that are damaged by the formation of the holes 23a, 23b are recovered by the annealing. This annealing is carried out in the oxygen containing atmosphere at the substrate temperature 550° C. for 60 minutes, for example.

Then, the second oxidation preventing film 22 formed on the second interlayer insulating film 18 is removed by the etch back. Accordingly, surfaces of the sixth to eighth conductive plugs 21a, 21d, 21e are exposed.

Next, steps required to form the structure shown in FIG. 2M will be explained hereunder.

First, a multi-layered metal film is formed on the upper electrodes 15a, 15b of the capacitors $Q_1$, $Q_2$, in the holes 23a, 23b, and on the second interlayer insulating film 18. As the multi-layered metal film, for example, a Ti film of 60 nm thickness, a TiN film of 30 nm thickness, an Al—Cu film of 400 nm thickness, a Ti film of 5 nm thickness, and a TiN film of 70 nm thickness are formed in sequence.

Then, in the memory cell region A, first-layer metal wirings 24a, 24b connected to the upper electrodes 15a, 15b via the holes 23a, 23b and a conductive pad 24c connected to the sixth conductive plug 21a are formed by patterning the multi-layered metal film. At the same time, in the logic region B, first-layer metal wirings 24d, 24e connected to the seventh and eighth conductive plug 21d, 21e are formed.

In this case, in order to prevent the reduction in the pattern precision by the reflection of the exposure light when the multi-layered metal film is patterned, the method of forming a reflection preventing film (not shown) such as silicon oxide nitride (SiON) on the multilayered metal film to have a thickness of 30 nm, then coating the resist on the reflection preventing film, then forming resist patterns such as wiring shapes, etc. by exposing/developing the resist, and then etching the multi-layered metal film by using the resist pattern is employed. The reflection preventing film may be left as it is after the multi-layered metal film is patterned.

In addition, a third interlayer insulating film 25 is formed on the second interlayer insulating film 18, the first-layer metal wirings 24a, 24b, 24d, 24e, and the conductive pad 24c.

Then, as shown in FIG. 2N, the third interlayer insulating film 25 is patterned, whereby a bit-line contact hole 25a is formed on the conductive pad 24c in the memory cell region A and at the same time a wiring contact hole 25b is formed on the first-layer metal wiring 24e in the logic region B. Also, ninth and tenth conductive plugs 26a, 26b each consisting of a Ti film, a TiN film, and a W film from the bottom are formed in the holes 25a, 25b respectively.

Then, second-layer metal wirings 27a, 27b containing the bit line BL are formed on the third interlayer insulating film 25. The bit line 27a, when connected to the ninth conductive plug 26a, is connected electrically to the first n-type impurity diffusion region 5a via the ninth conductive plug 26a, the conductive pad 24c, the sixth conductive plug 21a, and the first conductive plug 10a.

Then, an insulating film for covering the second-layer metal wirings 27a, 27b, and others are formed. Finally a cover film consisting of a TEOS-material silicon oxide film and a silicon nitride film is formed, but its detail will be omitted hereunder.

In the logic region B, like the p-type MOS transistor $T_3$, the conductive plug is also formed on the n-type MOS transistor (not shown). This is similarly applicable to other embodiments described later.

In the above embodiment, in the memory cell region A and the logic region B, the thermal resistance of the first to third conductive plugs 10a, 10b, 10c that are not formed directly under the lower electrodes 13a, 13b of the capacitors $Q_1$, $Q_2$ depend on the oxygen permeability of the overlying oxidation preventing film 11a. Therefore, when the thickness of the oxidation preventing film 11a is set in excess of 70 nm, the oxidation of the tungsten constituting the first to third conductive plugs 10a, 10b, 10c can be prevented.

In contrast, when the annealing process such as the crystallization annealing, the recovery annealing, or the like of the ferroelectric film 14 constituting the capacitors $Q_1$, $Q_2$ are carried out, the thermal resistance of the fourth and fifth conductive plugs 12a, 12b formed immediately under the lower electrodes 13a, 13b of the capacitors $Q_1$, $Q_2$ depends on not only their own material but also the oxygen permeability of the lower electrodes 13a, 13b.

Like the prior art, if the fourth and fifth conductive plugs 12a, 12b are formed by the same tungsten as the second and third conductive plugs in the logic region B, the film thickness of the lower electrodes 13a, 13b must be formed considerably thick in order to prevent the oxidation of the tungsten under the lower electrodes 13a, 13b.

For instance, the oxidation of the tungsten under the lower electrodes 13a, 13b can be prevented by the oxygen annealing that is executed at about 550° C. for 30 minutes. However, in order to increase the temperature of the oxygen annealing by 100° C. while preventing the oxidation of the tungsten, the film thickness of the iridium film 13x constituting the lower electrodes 13a, 13b must be set experimentally to almost 400 nm.

The increase in the film thickness of the iridium film 13x leads to the increase in the film thickness of the lower electrodes 13a, 13b. While, in the step of forming the capacitors $Q_1$, $Q_2$, in order to prevent the adhesion of the conductive material onto the side surfaces of the capacitors $Q_1$, $Q_2$, such side surfaces of the capacitors $Q_1$, $Q_2$ must be formed in a taper shape. As a result, the bottom area of the capacitors $Q_1$, $Q_2$ is increased larger as the film thickness of the lower electrodes 13a, 13b becomes thicker.

However, the increase in the film thickness of the lower electrodes 13a, 13b causes the increase in size of the lower electrodes 13a, 13b, which is contrary to the market's request of the miniaturization of the capacitor.

In contrast, in the present embodiment, since the fourth and fifth conductive plugs 12a, 12b formed immediately under the lower electrodes 13a, 13b of the capacitors $Q_1$, $Q_2$ are formed of the polysilicon that is excellent in the oxidation resistance, there is no necessity to increase the film thickness of the iridium film 13x formed thereon up to 400 nm.

By the way, since the FeRAM has the larger level difference on the substrate than the logic product by formation of the capacitor, the aspect ratio of the contact holes that connect the first-layer metal wirings 24d, 24e and the conductive pad 24c to the impurity diffusion regions 5a, 5d, 5e on the silicon substrate 1 is increased. Assume that a plurality of insulating films from the second interlayer insulating film 18 to the cover insulating film 7 are formed collectively by the etching like the prior art, not only the etching itself becomes difficult but also the filling of the glue film into the contact holes becomes difficult. Therefore, the up-to-date equipments must be newly introduced.

On the contrary, like the present embodiment, forming two-stage conductive plugs 10a, 21a in the memory cell region A and also two-stage conductive plugs 10d, 24d in the logic region B leads to improve the yield of the FeRAM or the logic-embedded FeRAM and to use the existing equipments. Therefore, the reduction in the development cost and the production cost can be achieved.

Also, in the present embodiment, the conductive plugs 12a, 12b directly under the capacitors $Q_1$, $Q_2$ are formed of silicon in the memory cell region A whereas the first-layer conductive plugs 10d, 10e are formed of tungsten in the logic region B. As a result, the design library of the logic product in the prior art can be employed and thus the reduction in the design cost can be realized.

(Second Embodiment)

In the above first embodiment, as shown in FIGS. 2I to 2L, the holes 23a, 23b, which are formed over the upper electrodes 15a, 15b of the capacitors $Q_1$, $Q_2$, and other holes 19a, 19b, 19c out of the holes formed in the second interlayer insulating film 18 are formed by separate steps. In this case, they may be formed simultaneously as described in the following.

First, the structure shown in FIG. 2I is formed in compliance with the steps shown in the first embodiment.

Figure 3A:
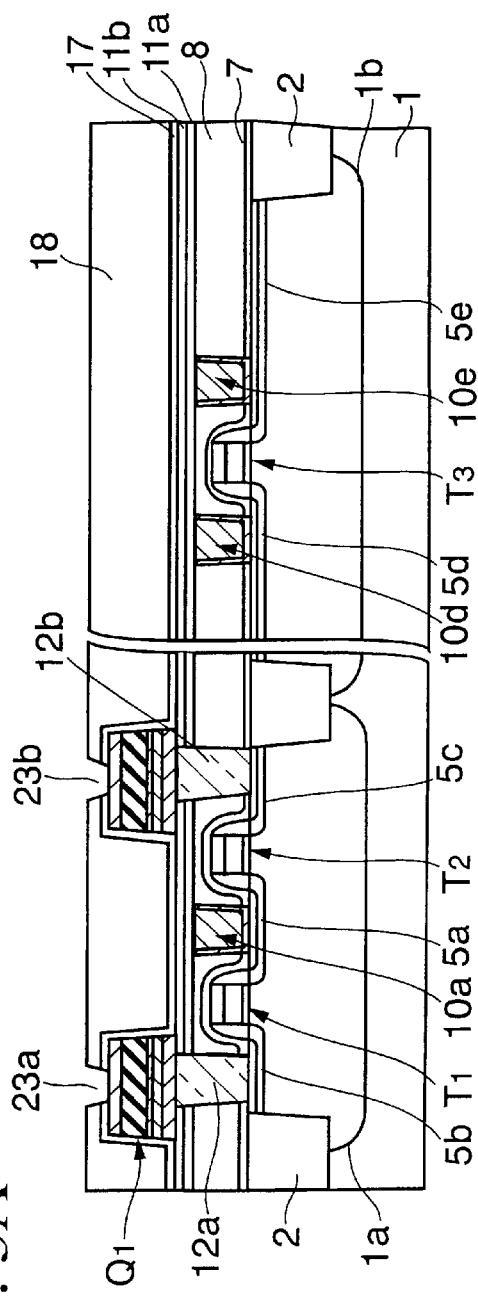
FIGS. 3A to 3D are sectional views showing steps of manufacturing a semiconductor device according to a second embodiment of the present invention.

Then, as shown in FIG. 3A, in the memory cell region A, the holes 23a, 23b are formed over the upper electrodes 15a, 15b of the capacitors $Q_1$, $Q_2$ by etching the second interlayer insulating film 18 and the capacitor protection film 17 while using the resist pattern (not shown). In this case, the upper electrodes 15a, 15b are exposed by etching the second interlayer insulating film 18 and the capacitor protection film 17 while using Ar, $C_4F_8$, and $O_2$ as the etching gas.

Then, in order to recover the damage of the ferroelectric film 14 caused by the etching, the annealing is applied to the capacitors $Q_1$, $Q_2$ in the oxygen containing atmosphere at the substrate temperature of 550° C. for 60 minutes, for example.

Figure 3B:
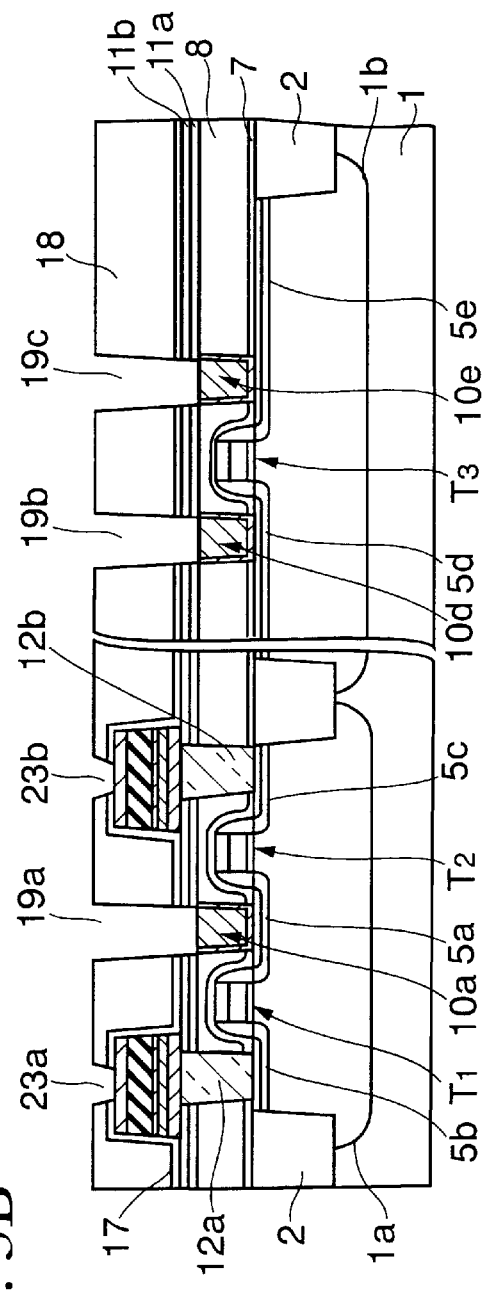

Then, as shown in FIG. 3B, the contact hole 19a and contact holes 19b, 19c are formed over the first conductive plug 10a in the memory cell region A and the second and third conductive plugs 10d, 10e in the logic region B respectively by using the resist pattern (not shown). The contact holes 19a, 19b, 19c are formed by the three-step etching. In the first step, the second interlayer insulating film 18, the capacitor protection film 17 made of alumina, and the underlying insulating film 11b are etched by using Ar, $C_4F_8$, and $O_2$ as the etching gas. In the second step, the deposited film on the oxidation preventing insulating film 11a is removed by using Ar and $O_2$ as the etching gas. In the third step, the first to third conductive plugs 10a, 10d, 10e are exposed by etching the oxidation preventing insulating film 11a while using Ar, $C_4F_8$, $CF_4$ and $O_2$ as the etching gas. Here, Ar, $CHF_3$, and $O_2$ may be used as the etching gas in the third step.

Figure 3C:
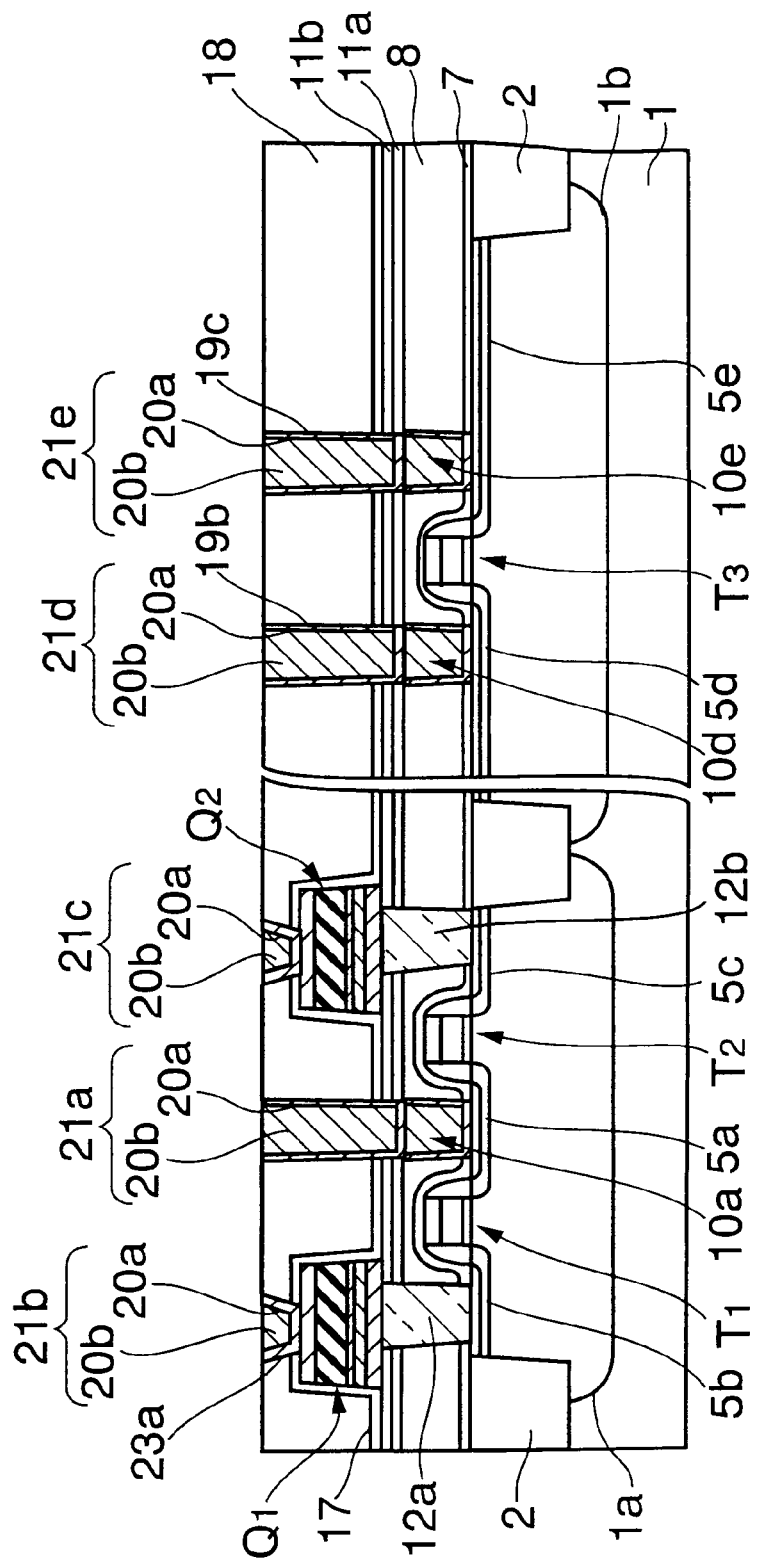

Next, steps required until the structure shown in FIG. 3C is obtained will be explained hereunder.

First, the TiN film of 50 nm thickness is formed sequentially as the glue film 20a in the holes 23a, 23b and the contact holes 19a to 19c and on the second interlayer insulating film 18 by the sputter method. Then, the tungsten film 20b is grown on the glue film 20a by the CVD method to fill the insides of the holes 23a, 23b and the contact holes 19a to 19c completely.

Then, the tungsten film 20b and the glue film 20a are removed from the upper surface of the second interlayer insulating film 18 by polishing by means of the CMP method. Accordingly, the tungsten film 20b and the glue film 20a left in the holes 23a, 23b on the capacitors $Q_1$, $Q_2$ are used as eleventh and twelfth conductive plugs 21b, 21c, and also the tungsten film 20b and the glue film 20a left in the contact hole 19a on the first conductive plug 10a in the memory cell region A are used as the sixth conductive plug 21a. In addition, the tungsten film 20b and the glue film 20a left in the contact holes 19b, 19c on the second and third conductive plugs 10d, 10e in the logic region B are used as the seventh and eighth conductive plugs 21d, 21e respectively.

Further, the second interlayer insulating film 18 is annealed in the nitrogen plasma atmosphere at 350° C. for 120 seconds.

As a result, unlike the first embodiment, the upper electrodes 15a, 15b of two capacitors $Q_1$, $Q_2$ in the memory cell region A are connected to the conductive plugs 21b, 21c having the tungsten respectively. Like the first embodiment, other conductive plugs 21a, 21d, 21e are connected to the first to third conductive plugs 10a, 10d, 10e respectively.

Figure 3D:
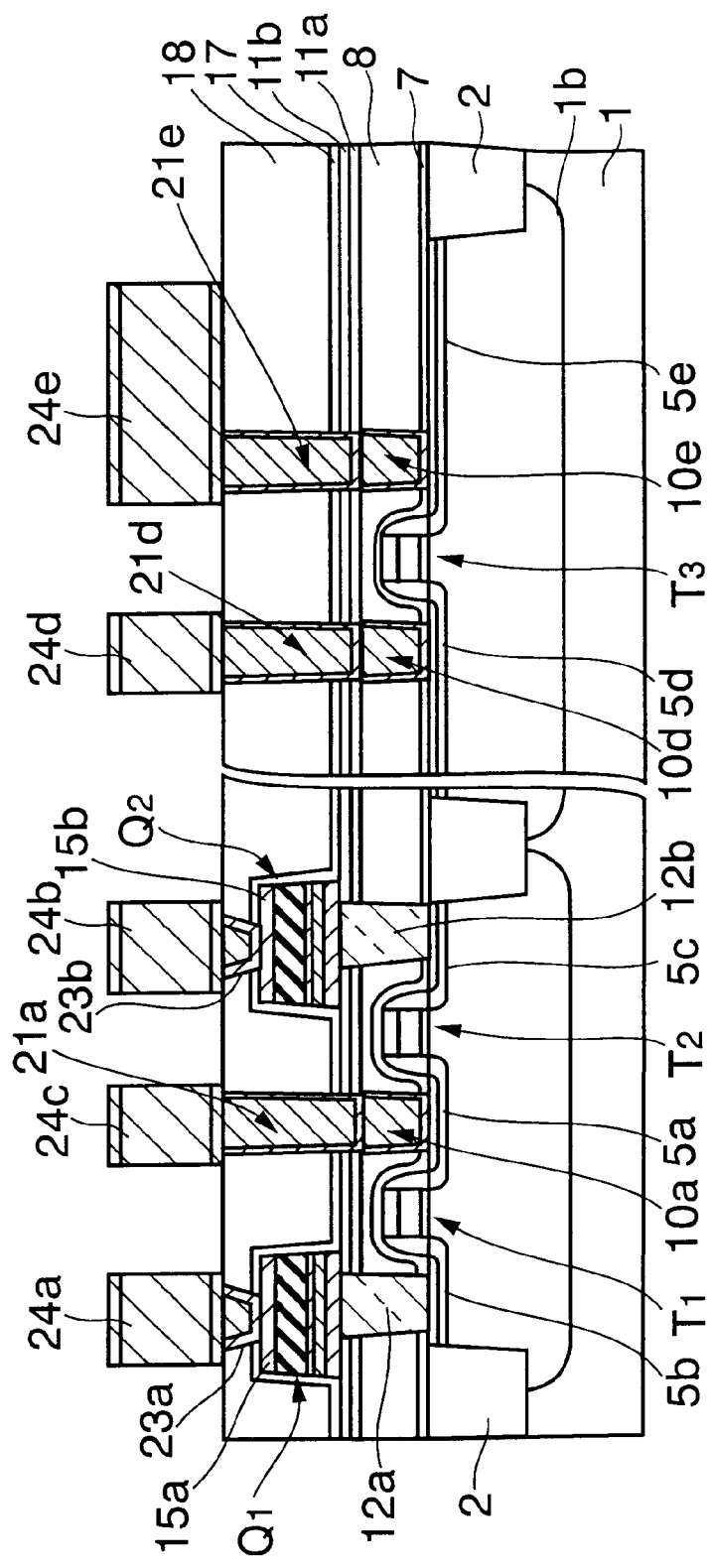

Next, steps required until the structure shown in FIG. 3D is formed will be explained hereunder.

First, a multi-layered metal film is formed on the sixth, seventh, eighth, eleventh and twelfth conductive plugs 21a to 21e and the second interlayer insulating film 18. As the multi-layered metal film, for example, a Ti film of 60 nm thickness, a TiN film of 30 nm thickness, an Al—Cu film of 400 nm thickness, a Ti film of 5 nm thickness, and a TiN film of 70 nm thickness are formed in sequence.

Then, the first-layer metal wirings 24a, 24b, 24d, 24e connected to the seventh, eighth, eleventh and twelfth conductive plugs 21b to 21e and the conductive pad 24c connected to the sixth conductive plug 21a are formed by patterning the multi-layered metal film.

In this case, in order to prevent the reduction in the pattern precision by the reflection of the exposure light when the multi-layered metal film is patterned, the reflection preventing film (not shown) pattern such as silicon oxide nitride (SiON), etc. may be employed, like the first embodiment.

Then, like the case shown in FIG. 2N in the first embodiment, the third interlayer insulating film 25 is formed on the second interlayer insulating film 18, the first-layer metal wirings 24a, 24b, 24d, 24e, and the conductive pad 24c, and then the bit line is connected to the upper surface of the conductive pad 24c via the conductive plug 25a. However, their details will be omitted.

As described above, since the holes 23a, 23b and the contact holes 19a to 19c to be formed in the second interlayer insulating film 18 are formed simultaneously, the patterning steps can be shortened.

In addition, since the oxidation preventing film formed on the second interlayer insulating film 18 in the first embodiment can be eliminated, the film forming step and the etching-back step can be omitted. Thus, the reduction in manufacturing steps can be achieved.

(Third Embodiment)

In the first and second embodiments, the first-layer metal wirings 24d, 24e and the conductive pad 24c are connected to the impurity diffusion regions 5a, 5d, 5e via two upper and lower conductive plugs 10a, 10d, 10e, 21a, 21d, 21e respectively.

For this reason, in the third embodiment, the formation of one conductive plug in place of upper and lower conductive plugs shown in the first embodiment will be explained hereunder.

First, like the case shown in FIG. 2A, the MOS transistors $T_1$, $T_2$, $T_3$ are formed on the silicon substrate 1 and then the cover insulating film 7 and the first interlayer insulating film 8 formed thereon in accordance with the method shown in the first embodiment.

Then, as shown in FIG. 4A, in the memory cell region A, the shallow contact holes 8b, 8c are formed on the second and third n-type impurity diffusion regions 5b, 5c respectively by etching the first interlayer insulating film 8 and the cover insulating film 7 using the resist pattern (not shown).

Then, the phosphorus-doped polysilicon film is formed on the first interlayer insulating film 8 and in the contact holes 8b, 8c by the CVD method under the conditions shown in the first embodiment.

Then, as shown in FIG. 4B, the polysilicon (semiconductor) film is removed from the upper surface of the first interlayer insulating film 8 by the CMP method. As a result, the polysilicon that is left in the contact holes 8b, 8c on the second and third n-type impurity diffusion regions 5b, 5c is used as the first and second conductive plugs 12a, 12b respectively.

In addition, as shown in FIG. 4C, like the first embodiment, the first conductive film, the ferroelectric film, and the second conductive film are formed sequentially on the conductive plugs 12a, 12b and the first interlayer insulating film 8, and then the capacitors $Q_1$, $Q_2$ are formed by patterning these films while using the hard mask. The capacitors $Q_1$, $Q_2$ have the structure that is formed by laminating the lower electrodes 13a, 13b connected to the first and second conductive plugs 12a, 12b and made of the first conductive film, the ferroelectric films 14a, 14b made of the ferroelectric material, and the upper electrodes 15a, 15b made of the second conductive film.

In this case, similarly to the first embodiment, the crystallization annealing is carried out after the formation of the ferroelectric films, and then the recovery annealing is carried out after the formation of the capacitors $Q_1$, $Q_2$.

Then, according to the same method as the first embodiment, the capacitor protection film 17 made of alumina, PZT, or the like is formed on the capacitors $Q_1$, $Q_2$ and the first interlayer insulating film 8, and then the second interlayer insulating film 18 made of $SiO_2$ is formed on the capacitor protection film 17.

In turn, as shown in FIG. 4D, the second interlayer insulating film 18, the capacitor protection film 17, the first interlayer insulating film 8, and the cover insulating film 7 are etched sequentially by using the resist pattern (not shown). Thus, a deep contact hole 18a is formed on the first impurity diffusion layer 5a in the memory cell region A and at the same time deep contact hole 18b, 18c are formed on the fourth and fifth impurity diffusion layers 5d, 5e in the logic region B. The aspect ratio of these contact holes 18a to 18c is almost 7.

Then, as shown in FIG. 4E, a titanium film of 30 nm thickness and a titanium nitride film of 50 nm thickness are formed as a glue film 28a on an upper surface of the second interlayer insulating film 18 and inner surfaces of the deep contact holes 18a, 18b, 18c by the sputter method or the CVD method. Then, a tungsten film 28b is grown on the glue film 28a by the CVD method using tungsten hexafluoride so as to bury the contact holes 18a to 18c perfectly.

Then, the tungsten film 28b and the glue film 28a are removed from the upper surface of the second interlayer insulating film 18 by polishing by virtue of the CMP method. As a result, the tungsten film 28b and the glue film 28a left in the deep contact hole 18a in the memory cell region A are used as a metallic third conductive plug 29a that is connected to the first n-type impurity diffusion region 5a. Also, the tungsten film 28b and the glue film 28a left in the deep contact holes 18b, 18c in the logic region B are used as metallic fourth and fifth conductive plugs 29b, 29c that are connected to the first and second p-type impurity diffusion regions 5d, 5e. The third to fifth conductive plugs 29a to 29c have a height that is exposed from the second interlayer insulating film 18.

In addition, the second interlayer insulating film 18 is annealed in the nitrogen atmosphere at 350° C. for 120 seconds.

After this, an oxidation preventing film 22 having a thickness of 100 nm and made of SiON is formed on the second interlayer insulating film 18 and the third to fifth conductive plugs 29a to 29c.

Then, as shown in FIG. 4F, the holes 23a, 23b are formed on the upper electrodes 15a, 15b of the capacitors $Q_1$, $Q_2$ by patterning the oxidation preventing film 22 and the second interlayer insulating film 18 by virtue of the photolithography method. The capacitors $Q_1$, $Q_2$ that are subjected to the damage by the formation of the holes 23a, 23b are recovered by the annealing. This annealing is carried out in the oxygen containing atmosphere at the substrate temperature 550° C. for 60 minutes, for example.

Then, the oxidation preventing film 22 formed on the second interlayer insulating film 18 is removed by the etch back. Accordingly, surfaces of the third to fifth conductive plugs 29a to 29c are exposed.

Figure 4G:
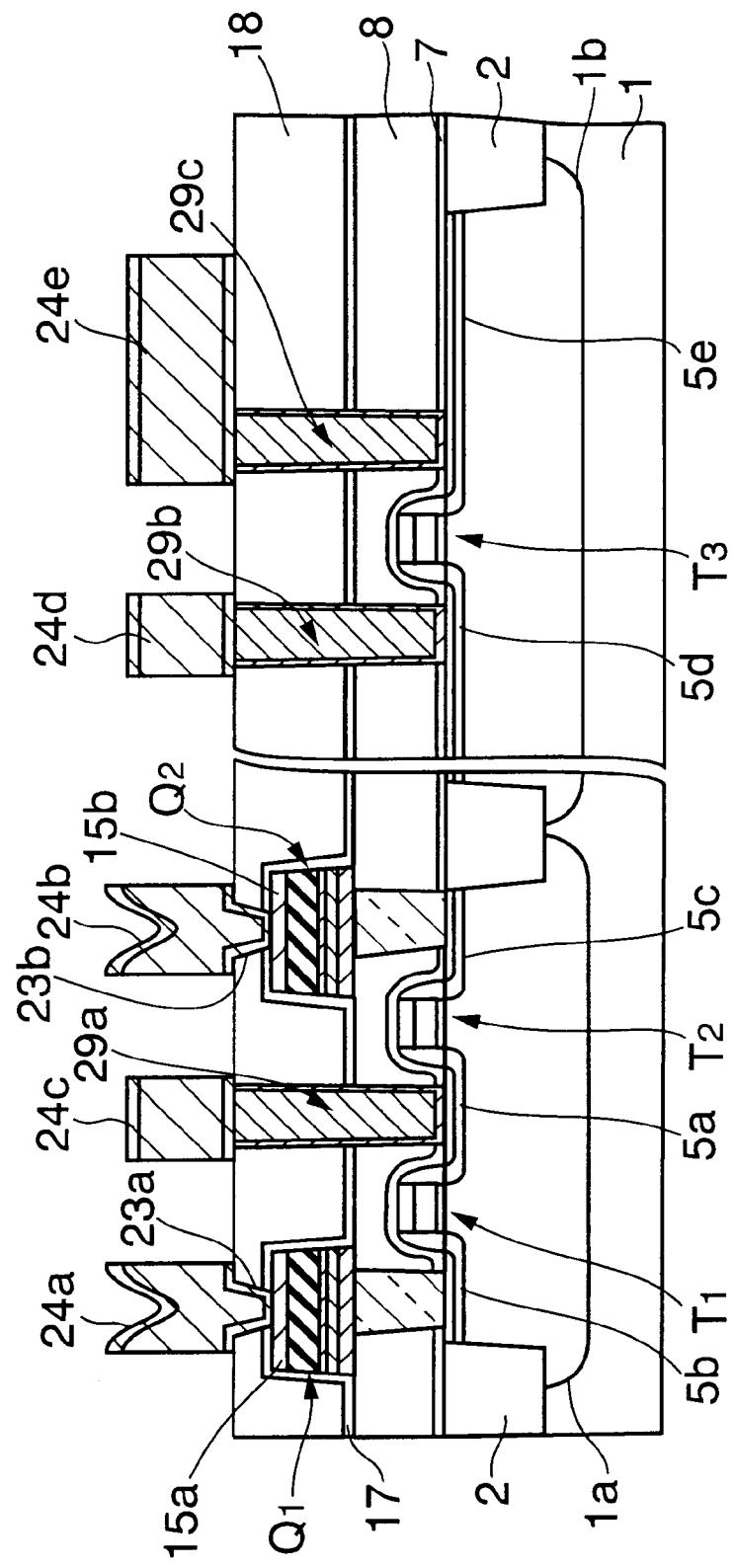

Next, steps required to form the structure shown in FIG. 4G will be explained hereunder.

First, the multi-layered metal film is formed on the upper electrodes 15a, 15b of the capacitors $Q_1$, $Q_2$, in the holes 23a, 23b, and on the second interlayer insulating film 18. As the multi-layered metal film, for example, a Ti film of 60 nm thickness, a TiN film of 30 nm thickness, an Al—Cu film of 400 nm thickness, a Ti film of 5 nm thickness, and a TiN film of 70 nm thickness are formed in sequence.

Then, in the memory cell region A, the first-layer metal wirings 24a, 24b connected to the upper electrodes 15a, 15b via the holes 23a, 23b and the conductive pad 24c connected to the third conductive plug 29a are formed by patterning the multi-layered metal film. At the same time, in the logic region B, the first-layer metal wirings 24d, 24e connected to the fourth and fifth conductive plug 29b, 29c are formed.

In this case, in order to prevent the reduction in the pattern precision by the reflection of the exposure light when the multi-layered metal film is patterned, the reflection preventing film (not shown) such as silicon oxide nitride (SiON), or the like is formed on the multilayered metal film.

Then, similarly to the case shown in FIG. 2N in the first embodiment, the third interlayer insulating film 25 is formed on the second interlayer insulating film 18, the first-layer metal wirings 24a, 24b, 24d, 24e, and the conductive pad 24c, and then the bit line is connected to the conductive pad 24c via the conductive plug 25a. Their details will be omitted.

As described above, in the third embodiment, the first and second conductive plugs 12a, 12b formed immediately under the capacitors $Q_1$, $Q_2$ are formed of silicon and also other conductive plugs are formed of metal. As a result, such first and second conductive plugs 12a, 12b are hard to be oxidized by the oxygen that enters from side surfaces of the capacitors $Q_1$, $Q_2$, and thus the contact failure can be prevented.

Also, in the third embodiment, in the memory cell region A, the first-stage conductive plug 29a is formed by forming the contact hole 18a, that connects the conductive pad 24c on the second interlayer insulating film 18 that covers the capacitors $Q_1$, $Q_2$ and the underlying first n-type impurity diffusion region 5a, via one etching step and then forming the metal film in the contact hole 18a. Also, in the logic region B, the first-stage conductive plugs 29b, 29c are formed by forming the contact hole 18b, 18c, that connect the first-layer metal wirings 24d, 24e on the second interlayer insulating film 18 and the underlying p-type impurity diffusion regions 5d, 5e, via one etching step and then forming the metal film in the contact holes 18b, 18c.

Therefore, in order to form the conductive plugs that connect the conductive pad 24c on the second interlayer insulating film 18 and the first-layer metal wirings 24d, 24e to the impurity diffusion regions 5a, 5d, 5e, there is no necessity that the oxidation preventing film should be formed on the first interlayer insulating film 8, unlike the first embodiment and the second embodiment. Thus, there can be achieved the advantages that the throughput can be improved by reducing the number of steps and also the cost can be cut down.

(Fourth Embodiment)

In the first, second, and third embodiments, since the conductive plugs 12a, 12b immediately under the capacitors $Q_1$, $Q_2$ are formed of the doped silicon, such conductive plugs 12a, 12b are difficult to be oxidized and thus the contact failure is prevented.

As the conductive plugs 12a, 12b, the oxide conductive material that is excellent in the thermal resistance and has less characteristic variation due to the oxidation may be employed in addition to silicon.

As such oxide conductive material, there are the noble metal oxide such as $IrO_x$, $PtO_x$, $RuO_x$, $SrRuO_x$, $LaSrCoO_x$, $LaNiO_x$, etc., the oxide obtained by doping the proper impurity into the oxide semiconductor represented by $ZuO_x$, and others. Where, x is the component number. In addition, there are $TiO_2$, $Fe_2O_3$ as the oxide semiconductor.

When the oxide conductive material is employed as the conductive plugs 12a, 12b, it is possible that the silicon constituting the n-type impurity diffusion regions 5b, 5c is oxidized. Therefore, it is preferable that the conductive contact layer should be interposed between the conductive plugs 12a, 12b and the n-type impurity diffusion regions 5b, 5c. It is preferable that, with regard to the diffusion of the element into the silicon substrate 1, the pure metal should not be employed but the compound such as the metal nitride, the metal silicide, etc. should be employed.

Figure 5A:
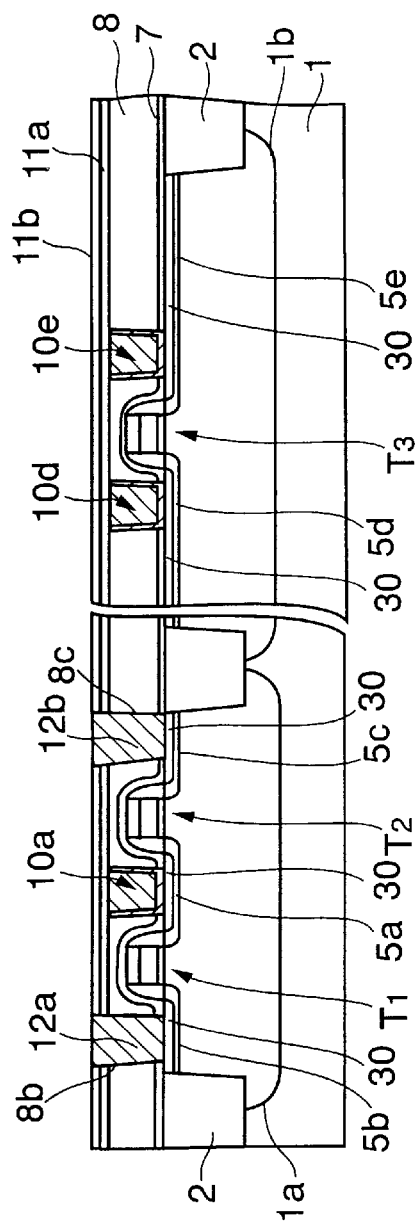
FIGS. 5A and 5B are sectional views showing steps of manufacturing a first semiconductor device according to a fourth embodiment of the present invention.
Figure 5B:
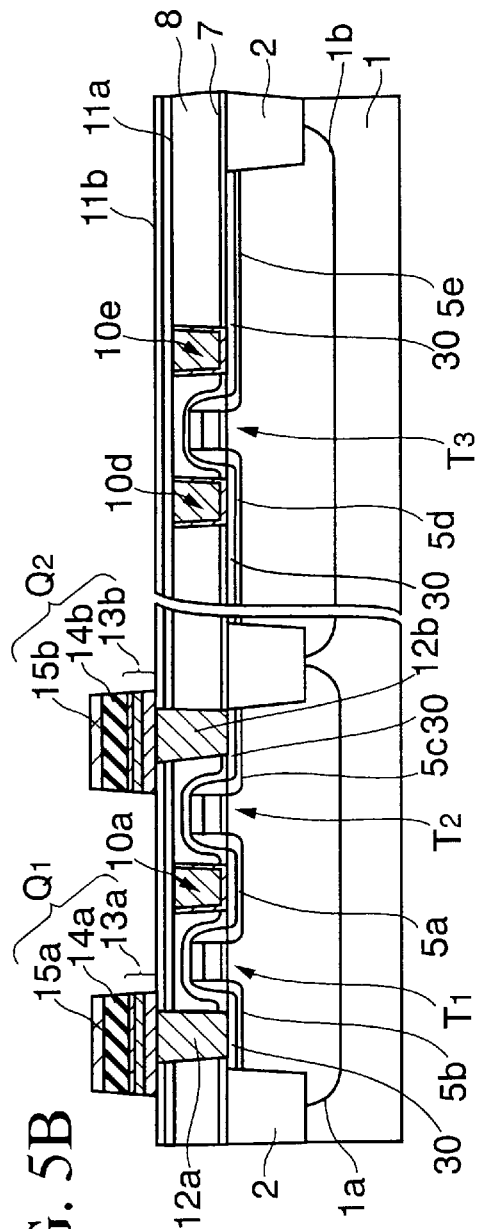
Figure 6A:
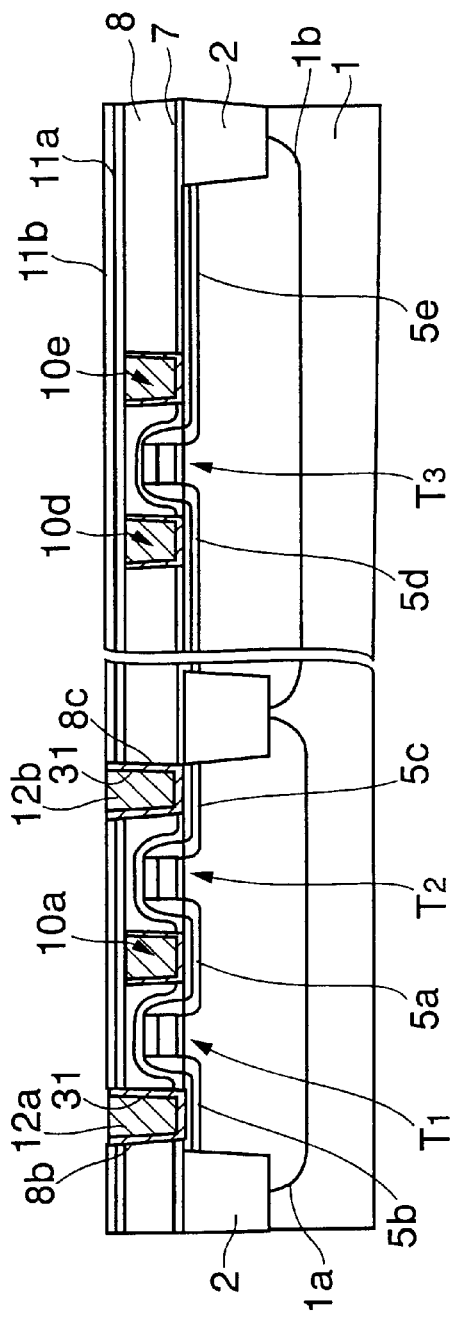
FIGS. 6A and 6B are sectional views showing steps of manufacturing a second semiconductor device according to the fourth embodiment of the present invention.
Figure 6B:
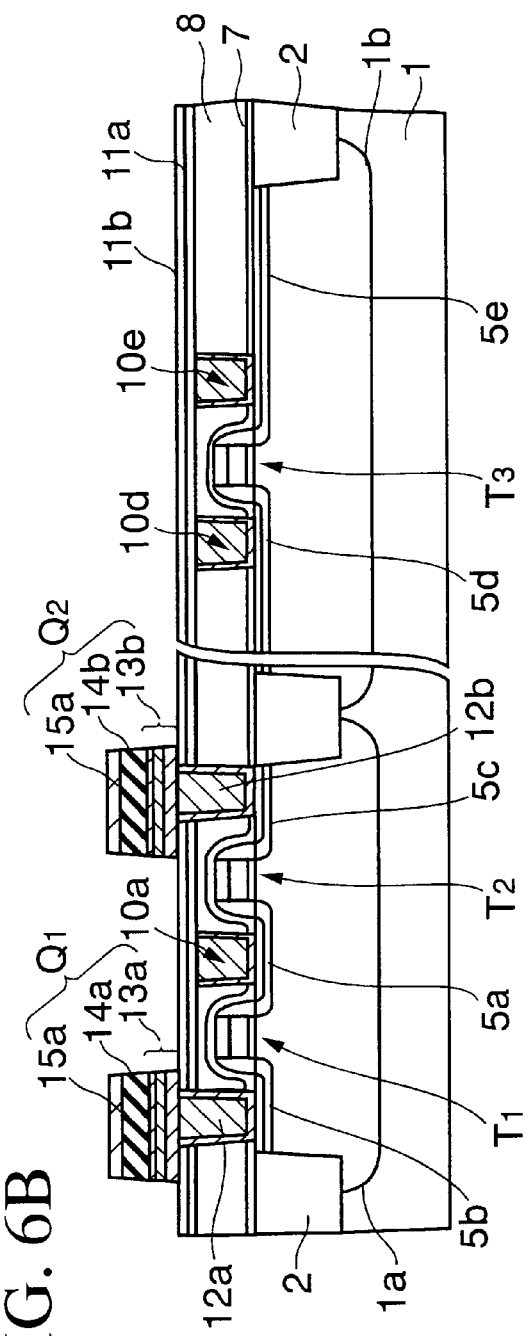

Next, a first example that the oxide conductive material is employed as the conductive plugs 12a, 12b will be explained with reference to FIGS. 5A and 5B and a second example will be explained with reference to FIGS. 6A and 6B hereunder. In FIGS. 5A and 5B and FIGS. 6A and 6B, the same symbols as those in FIG. 2A to FIG. 2N denote the same constituent elements.

FIRST EXAMPLE

First, as shown in FIG. 5A, in the memory cell region A, the MOS transistors $T_1$, $T_2$ are formed on the silicon substrate 1, and then the metal silicide layer such as cobalt silicide, titanium silicide, or the like is formed as a contact layer 30 on the surfaces of the second and third n-type impurity diffusion regions 5b, 5c by the salicide technology. Also, the metal silicide may be formed on the surfaces of other impurity diffusion regions 5a, 5d, 5e in the memory cell region A and the logic region B.

Then, the cover insulating film 7 and the first interlayer insulating film 8 for covering the MOS transistors $T_1$, $T_2$, $T_3$ are formed sequentially. Then, like the first embodiment, the first to third conductive plugs 10a, 10d, 10e are formed, and then the first oxidation preventing insulating film 11a and the underlying insulating film 11b are formed on the first to third conductive plugs 10a, 10d, 10e and the first interlayer insulating film 8.

Then, in the memory cell region A, the contact holes 8b, 8c are formed on the second and third n-type impurity diffusion regions 5b, 5c, and then the oxide conductive material is formed therein. Then, the oxide conductive material on the underlying insulating film 11b is removed by the CMP method. Accordingly, the oxide conductive material left in the contact holes 8b, 8c on the second and third n-type impurity diffusion regions 5b, 5c in the memory cell region A is employed as the conductive plugs 12a, 12b.

Then, as shown in FIG. 5B, like the first embodiment, the capacitors $Q_1$, $Q_2$ are formed on the conductive plugs 12a, 12b. Subsequent steps are carried out pursuant to those in the first embodiment.

Second Embodiment

First, as shown in FIG. 6A, the MOS transistors $T_1$, $T_2$ are formed on the silicon substrate 1, and then the cover insulating film 7 and the first interlayer insulating film 8 for covering the MOS transistors $T_1$, $T_2$, $T_3$ are formed sequentially. Then, like the first embodiment, the first to third conductive plugs 10a, 10d, 10e are formed, and then the first oxidation preventing insulating film 11a and the underlying insulating film 11b are formed on the first to third conductive plugs 10a, 10d, 10e and the first interlayer insulating film 8.

Then, in the memory cell region A, the contact holes 8b, 8c are formed on the second and third n-type impurity diffusion regions 5b, 5c.

Then, the metal nitride film such as titanium nitride, or the like is formed as a contact layer 31 on inner surfaces and bottom surfaces of the contact holes 8b, 8c and on the underlying insulating film 11b. Further, the oxide conductive material is formed on the contact layer 31 to fill the insides of the contact holes 8b, 8c. Then, the oxide conductive material and the contact layer 31 on the underlying insulating film 11b are removed by the CMP method. As a result, in the memory cell region A, the oxide conductive material left in the contact holes 8b, 8c on the second and third n-type impurity diffusion regions 5b, 5c is employed as the conductive plugs 12a, 12b.

In turn, as shown in FIG. 6B, like the first embodiment, the capacitors $Q_1$, $Q_2$ are formed on the conductive plugs 12a, 12b. Subsequent steps are carried out pursuant to those in the first embodiment.

The conductive plugs 12a, 12b made of the oxide conductive material as described above are not changed even when they come into contact with the oxygen at the time of the crystallization annealing or the recovery annealing. Thus, the defective contact between the capacitors $Q_1$, $Q_2$ and the n-type impurity diffusion regions 5b, 5c is not generated.

In this case, the conductive plugs 12a, 12b made of the oxide conductive material as described above and the contact layers 30, 31 may be employed in the second and third embodiments.

In the above embodiments, the dielectric film of the capacitor is formed of the ferroelectric substance, but such film may be formed of the high-dielectric material.

As described above, according to the present invention, the conductive material constituting the conductive plugs formed directly under the lower electrode of the capacitor is formed of the material that is hard to be oxidized rather than the metal constituting remaining conductive plugs. Therefore, in the situation that the conductive film serving as the lower electrode of the capacitor is formed, the conductive plug formed immediately under the lower electrode is difficult to be oxidized. As a result, even when the oxygen annealing is carried out thereafter, the connection between the capacitor and the impurity diffusion region can be still maintained good and thus the yield of the device can be improved.

Also, other conductive plugs not formed immediately under the capacitor are formed of the metal film, which has the smaller conductivity than the doped silicon or the oxide conductive material, to consider preferentially the reduction in the electric resistance. Therefore, the conventional design rule can be applied to the logic circuit and the bit signal.

What is claimed is:

1. A semiconductor device comprising:
   first and second impurity diffusion regions constituting a transistor formed on a semiconductor substrate;
   a first insulating film formed over the semiconductor substrate;
   a first hole formed in the first insulating film over the first impurity diffusion region;
   a first conductive plug formed in the first hole and made of a metal film;
   a second hole formed in the first insulating film over the second impurity diffusion region;
   a second conductive plug formed in the second hole and made of conductive material that is hard to be oxidized rather than the metal film; and
   a capacitor comprising a lower electrode connected to an upper surface of the second conductive plug, a dielectric film formed of one of either a ferroelectric substance or a high-dielectric substance, and an upper electrode.

2. A semiconductor device according to claim 1, wherein the conductive material constituting the second conductive plug is oxide conductive material.

3. A semiconductor device according to claim 2, wherein the oxide conductive material is one of either a noble metal oxide or a doped oxide semiconductor.

4. A semiconductor device according to claim 3, wherein a contact layer made of one of either a metal nitride or a metal silicide compound is formed between the second conductive plug made of the oxide conductive material and the second impurity diffusion region.

5. A semiconductor device according to claim 1, wherein the metal film contains tungsten.

6. A semiconductor device according to claim 1, further comprising:
   a third impurity diffusion region formed in the semiconductor substrate;
   a third hole formed in the first insulating film over the third impurity diffusion region; and
   a third conductive plug formed in the third hole and made of a same material as the metal film.

7. A semiconductor device according to claim 6, further comprising:
   a second insulating film formed over the capacitor and the first insulating film;
   a fourth hole formed in the second insulating film over the third conductive plug; and
   a fourth conductive plug formed in the fourth hole and connected to the third conductive plug.

8. A semiconductor device according to claim 6, wherein a third insulating film is formed over the capacitor and the first insulating film,
   the third hole is formed in the first insulating film and the third insulating film, and
   the third conductive plug in the third hole is formed at a height that is exposed from the third insulating film.

9. A semiconductor device according to claim 1, further comprising:
   a second insulating film formed over the capacitor and the first insulating film;
   a fifth hole formed in the second insulating film on the first conductive plug; and
   a fifth conductive plug formed in the fifth hole and connected to the first conductive plug.

10. A semiconductor device according to claim 1, wherein a second insulating film is formed over the capacitor and the first insulating film,
    the first hole is formed in the first insulating film and the second insulating film, and
    the first conductive plug in the first hole is formed at a height that is exposed from the second insulating film.

11. A semiconductor device according to claim 7, wherein a sixth hole is formed in the second insulating film on the upper electrode of the capacitor, and
    a wiring connected electrically to the upper electrode via the sixth hole is formed on the second insulating film.

12. A semiconductor device according to claim 1, wherein an oxidation preventing film is formed on the first insulating film around the first hole and under the capacitor.

13. A semiconductor device according to any one of claim 6, wherein the first and second impurity diffusion regions are formed in a memory cell region of the semiconductor substrate, and the third impurity diffusion region is formed in a logic region of the semiconductor substrate.

14. A semiconductor device manufacturing method comprising the steps of:
    forming a transistor having first and second impurity diffusion regions formed in a semiconductor substrate;
    forming a first insulating film, which covers the transistor, over the semiconductor substrate;
    forming a first hole in the first insulating film over the first impurity diffusion region;
    forming a first conductive plug made of a metal film in the first hole;
    forming a second hole in the first insulating film over the second impurity diffusion region;
    forming a second conductive plug, which is made of conductive material that is hard to be oxidized rather than the metal film, in the second hole;
    forming a first conductive film, a dielectric film made of any one of ferroelectric substance and high-dielectric substance, and a second conductive film sequentially on the second conductive plug and the first insulating film; and
    forming a capacitor on the second conductive plug by patterning the second conductive film, the dielectric film, and the first conductive film.

15. A semiconductor device manufacturing method according to claim 14, wherein forming the conductive material constituting the second conductive plug is forming one of doped silicon and oxide conductive material.

16. A semiconductor device manufacturing method according to claim 14, wherein the step of forming the metal film constituting the first conductive plug is the step of forming sequentially a glue film and a tungsten film.

17. A semiconductor device manufacturing method according to claim 14, further comprising the step of:

annealing the capacitor in an oxygen containing atmosphere after the capacitor is formed.

18. A semiconductor device manufacturing method according to claim 14, further comprising the steps of:

forming a third impurity diffusion region, which is covered with the first insulating film, in the semiconductor substrate;

forming a third hole in the first insulating film over the third impurity diffusion region; and forming a third conductive plug, which is made of a same material as the metal film, in the third hole.

19. A semiconductor device manufacturing method according to claim 14, further comprising the steps of:

forming an oxidation preventing insulating film on the first conductive plug and the first insulating film after the first conductive plug is formed;

forming the second hole in the oxidation preventing insulating film and the first insulating film; and forming the second conductive plug in the second hole.

20. A semiconductor device manufacturing method according to claim 14, further comprising the steps of:

forming a second insulating film, which covers the capacitor, over the first insulating film;

forming a fourth hole in the second insulating film over the first conductive plug; and forming a fourth conductive plug in the fourth hole.

21. A semiconductor device manufacturing method according to claim 20, further comprising the steps of:

forming a fifth hole in the second insulating film on the second conductive film of the capacitor at a same time when the fourth hole is formed; and forming a fifth conductive plug in the fifth hole at a same time when the fourth conductive plug is formed in the fourth hole.

22. A semiconductor device manufacturing method according to claim 20, further comprising the steps of:

forming an oxidation preventing film on the fourth conductive plug and the second insulating film;

forming a fifth hole on the second conductive film of the capacitor by patterning the oxidation preventing film and the second insulating film;

removing the oxidation preventing film; and forming a wiring containing a pattern, which is connected to the second conductive film of the capacitor via the fifth hole, on the second insulating film.

23. A semiconductor device manufacturing method according to claim 14, further comprising the steps of:

forming a second insulating film, which covers the capacitor, over the first insulating film;

forming the first hole in the second insulating film and the first insulating film; and forming the first conductive plug in the first hole.

24. A semiconductor device according to claim 1, wherein the conductive material constituting the second conductive plug is doped silicon.

* * * * *